United States Patent
Yee et al.

(10) Patent No.: US 9,691,688 B2
(45) Date of Patent: Jun. 27, 2017

(54) THIN PLASTIC LEADLESS PACKAGE WITH EXPOSED METAL DIE PADDLE

(71) Applicant: Carsem (M) Sdn. Bhd., Ipoh, Perak (MY)

(72) Inventors: Mow Lum Yee, Perak (MY); Kam Chuan Lau, Perak (MY); Kok Siang Goh, Perak (MY); Shang Yan Choong, Perak (MY); Voon Joon Liew, Perak (MY); Chee Sang Yip, Perak (MY)

(73) Assignee: CARSEM (M) SDN. BHD., Ipoh, Perak (MY)

( * ) Notice: Subject to any disclaimer, the term of this patent is extended or adjusted under 35 U.S.C. 154(b) by 0 days.

(21) Appl. No.: 14/922,899

(22) Filed: Oct. 26, 2015

(65) Prior Publication Data
US 2016/0049357 A1    Feb. 18, 2016

Related U.S. Application Data

(63) Continuation of application No. 11/929,418, filed on Oct. 30, 2007, now Pat. No. 9,190,385.

(30) Foreign Application Priority Data

Jul. 25, 2007  (MY) .................................. 20071214

(51) Int. Cl.
*H01L 23/495*   (2006.01)
*H01L 21/48*    (2006.01)
(Continued)

(52) U.S. Cl.
CPC .... *H01L 23/49541* (2013.01); *H01L 21/4821* (2013.01); *H01L 21/4825* (2013.01);
(Continued)

(58) Field of Classification Search
CPC ......... H01L 23/49541; H01L 23/49568; H01L 23/49582; H01L 23/4952; H01L 23/3114;
(Continued)

(56) References Cited

U.S. PATENT DOCUMENTS 4,778,146 A  10/1988  Olla et al.
6,184,575 B1  2/2001  Chillara et al.
(Continued)

FOREIGN PATENT DOCUMENTS

CN  1490870 A  4/2006
CN  1842906 A  10/2006

OTHER PUBLICATIONS

Non-Final Office Action for U.S. Appl. No. 11/929,418 dated Nov. 2, 2009, 17 pages.
(Continued)

*Primary Examiner* — Minh-Loan Tran
*Assistant Examiner* — Farid Khan
(74) *Attorney, Agent, or Firm* — Kilpatrick Townsend & Stockton LLP

(57) ABSTRACT

A method of making electronic packages includes providing a leadframe strip that includes a plurality of leadframes, wherein the leadframes comprise a plurality of leads, etching a surface of each of the leadframes to form an opening, wherein each of the leads has a lead tip that connects to a die paddle within the opening, isolating each of the leads from the die paddle, adhering a tape to a bottom side of the leadframe strips, leads, and die paddle, attaching a die to the die paddle, placing ball bumps on each of the lead tips, and connecting the die to the ball bumps. The electronic package includes a leadframe having a plurality of leads, wherein each of the leads has a lead tip, an opening formed within the leadframe, a die paddle that is disposed within the opening and is isolated from each of the lead tips, a tape that is
(Continued)

adhered to a back side of the leadframe, leads, and die paddle, and a die, wherein the die is attached to the die paddle and is connected by wires to a bump disposed on each of the lead tips.

5 Claims, 24 Drawing Sheets

(51) Int. Cl.
*H01L 21/56* (2006.01)
*H01L 21/683* (2006.01)
*H01L 23/31* (2006.01)
*H01L 23/00* (2006.01)
*H01L 21/60* (2006.01)

(52) U.S. Cl.
CPC ........ *H01L 21/4828* (2013.01); *H01L 21/565* (2013.01); *H01L 21/568* (2013.01); *H01L 21/6835* (2013.01); *H01L 23/3114* (2013.01); *H01L 23/3121* (2013.01); *H01L 23/4952* (2013.01); *H01L 23/49503* (2013.01); *H01L 23/49568* (2013.01); *H01L 23/49582* (2013.01); *H01L 24/29* (2013.01); *H01L 24/32* (2013.01); *H01L 24/48* (2013.01); *H01L 24/83* (2013.01); *H01L 24/97* (2013.01); *H01L 23/4951* (2013.01); *H01L 24/45* (2013.01); *H01L 24/49* (2013.01); *H01L 24/81* (2013.01); *H01L 2021/60022* (2013.01); *H01L 2021/60277* (2013.01); *H01L 2224/0401* (2013.01); *H01L 2224/05155* (2013.01); *H01L 2224/05554* (2013.01); *H01L 2224/05644* (2013.01); *H01L 2224/05664* (2013.01); *H01L 2224/13099* (2013.01); *H01L 2224/13101* (2013.01); *H01L 2224/13144* (2013.01); *H01L 2224/13147* (2013.01); *H01L 2224/16245* (2013.01); *H01L 2224/2732* (2013.01); *H01L 2224/2919* (2013.01); *H01L 2224/29101* (2013.01); *H01L 2224/32245* (2013.01); *H01L 2224/32257* (2013.01); *H01L 2224/45124* (2013.01); *H01L 2224/45144* (2013.01); *H01L 2224/45147* (2013.01); *H01L 2224/4848* (2013.01); *H01L 2224/48091* (2013.01); *H01L 2224/48095* (2013.01); *H01L 2224/48247* (2013.01); *H01L 2224/48465* (2013.01); *H01L 2224/48471* (2013.01); *H01L 2224/48475* (2013.01); *H01L 2224/48479* (2013.01); *H01L 2224/48483* (2013.01); *H01L 2224/48499* (2013.01); *H01L 2224/48644* (2013.01); *H01L 2224/48664* (2013.01); *H01L 2224/48764* (2013.01); *H01L 2224/48844* (2013.01); *H01L 2224/48864* (2013.01); *H01L 2224/49171* (2013.01); *H01L 2224/73265* (2013.01); *H01L 2224/8121* (2013.01); *H01L 2224/81205* (2013.01); *H01L 2224/81207* (2013.01); *H01L 2224/81815* (2013.01); *H01L 2224/8385* (2013.01); *H01L 2224/83101* (2013.01); *H01L 2224/83191* (2013.01); *H01L 2224/83192* (2013.01); *H01L 2224/83862* (2013.01); *H01L 2224/85051* (2013.01); *H01L 2224/85181* (2013.01); *H01L 2224/85186* (2013.01); *H01L 2224/85207* (2013.01); *H01L 2224/85444* (2013.01); *H01L 2224/85986* (2013.01); *H01L 2224/92247* (2013.01); *H01L 2224/97* (2013.01); *H01L 2924/014* (2013.01); *H01L 2924/01006* (2013.01); *H01L 2924/01013* (2013.01); *H01L 2924/01015* (2013.01); *H01L 2924/01029* (2013.01); *H01L 2924/01033* (2013.01); *H01L 2924/01078* (2013.01); *H01L 2924/01079* (2013.01); *H01L 2924/01082* (2013.01); *H01L 2924/0665* (2013.01); *H01L 2924/0781* (2013.01); *H01L 2924/07802* (2013.01); *H01L 2924/15747* (2013.01); *H01L 2924/181* (2013.01)

(58) Field of Classification Search
CPC ............. H01L 23/3121; H01L 21/4825; H01L 21/4828; H01L 21/565; H01L 21/568; H01L 21/4821; H01L 21/6835; H01L 24/29; H01L 24/32; H01L 24/83; H01L 24/48; H01L 24/97
See application file for complete search history.

(56) References Cited

U.S. PATENT DOCUMENTS

| | | |
|---|---|---|
| 6,229,200 B1 | 5/2001 | Mclellan et al. |
| 6,239,496 B1 | 5/2001 | Asada |
| 7,563,648 B2* | 7/2009 | Islam .................. H01L 21/4832 257/670 |
| 7,709,935 B2 | 5/2010 | Islam et al. |
| 2003/0137033 A1 | 7/2003 | Karashima et al. |
| 2003/0168719 A1 | 9/2003 | Cheng et al. |
| 2003/0197290 A1 | 10/2003 | Crowley et al. |
| 2004/0080025 A1* | 4/2004 | Kasahara ............ H01L 21/4821 257/666 |
| 2004/0217450 A1 | 11/2004 | Li et al. |
| 2005/0051877 A1* | 3/2005 | Hsu ..................... H01L 21/4821 257/667 |
| 2005/0224940 A1* | 10/2005 | Tangpuz ........... H01L 23/49562 257/678 |
| 2007/0111374 A1* | 5/2007 | Islam .................. H01L 21/4832 438/106 |
| 2007/0164403 A1 | 7/2007 | Huang et al. |
| 2008/0258278 A1* | 10/2008 | Ramos ................... H01L 24/36 257/676 |

OTHER PUBLICATIONS

Non-Final Office Action for U.S. Appl. No. 11/929,418 dated Sep. 17, 2014, 24 pages.
Final Office Action for U.S. Appl. No. 11/929,418 dated May 26, 2010, 14 pages.
Final Office Action for U.S. Appl. No. 11/929,418 dated May 21, 2015, 15 pages.
Notice of Allowance for U.S. Appl. No. 11/929,418 dated Jul. 17, 2015, 9 pages.

* cited by examiner

THIN PLASTIC LEADLESS PACKAGE WITH EXPOSED METAL DIE PADDLE

CROSS-REFERENCES TO RELATED APPLICATIONS

This application is a continuation of U.S. application Ser. No. 11/929,418, filed Oct. 30, 2007, which claims priority to Malaysia Application No. PI 20071214, filed Jul. 25, 2007, both of which are incorporated herein by reference in their entirety for all purposes.

BACKGROUND OF THE INVENTION

As electronic devices become smaller, the electronic packages that make up the electronic devices have become smaller. As such, manufacturers are constantly searching for ways to make thinner packages. They often try to reduce the size or thickness of the packaging components. To this end, manufacturers also may try to eliminate packaging components by modifying and utilizing other components more efficiently. Currently manufacturers have developed package designs and corresponding manufacturing methods, in which the package thickness has reached 0.3 mm.

However, to produce smaller and thinner packages is challenging because there are components that are deemed to be essential for packaging and cannot be eliminated. In addition, to manufacture smaller packages the packaging technology and process may need to be altered substantially, thereby adding to the manufacturing costs. As such, there is a need for a smaller and thinner package design and a method to manufacture the same, especially to achieve a package thickness of 0.2 mm or less.

BRIEF SUMMARY OF THE INVENTION

Embodiments of the present invention provide systems and methods that use a leadframe as the main structure of the package so that the leadframe thickness is the thickness of the package. Embodiments of the present invention also provide methods of achieving a 0.2 mm thin plastic leadless package with an exposed metal die paddle (exposed heatsink).

In one embodiment of the present invention, a method of making packages includes providing a leadframe strip having a plurality of leadframes, wherein the leadframes have a plurality of leads, etching a surface of each of the leadframes to form an opening, wherein each of the leads has a lead tip that connects to a die paddle within the opening, isolating each of the leads from the die paddle, adhering a tape to a bottom side of the leadframe strips, leads, and die paddle, attaching a die to the die paddle, placing ball bumps on each of the lead tips, and connecting the die to the ball bumps.

In another embodiment of the present invention, molded ribs are formed on the leadframe strips.

In yet another embodiment of the present invention, the method includes creating a mold cap over the opening, thereby encapsulating the die.

In yet another embodiment of the present invention, the method includes singulating the leadframe strips.

In yet another embodiment of the present invention, the method includes applying a layer of epoxy to a back side of the die, and placing the back side of the die on top of the die paddle.

In yet another embodiment of the present invention, the method of connection is done by wire-bonding.

In yet another embodiment of the present invention, the method further includes coating the leadframe strip with NiPdAu.

In another embodiment of the present invention, an electronic package includes a leadframe having a plurality of leads, wherein each of the leads has a lead tip, an opening formed within the leadframe, a die paddle that is disposed within the opening and is isolated from each of the lead tips, a tape that is adhered to a back side of the leadframe, leads, and die paddle, and a die, wherein the die is attached to the die paddle and is connected by wires to a bump disposed on each of the lead tips.

In yet another embodiment of the present invention, the electronic package further includes a mold cover that encapsulates the opening.

In yet another embodiment of the present invention, the mold cover of the electronic package is selected from a group consisting of flushed mold cap, raised flat mold cap, and dome-shaped mold cap.

In yet another embodiment of the present invention, the opening of the electronic package has a predetermined depth.

In yet another embodiment of the present invention, the die paddle of the electronic package has a thickness that is smaller than the predetermined depth of the opening, and is configured to fit within the opening.

In yet another embodiment of the present invention, the die of the electronic package has a thickness that is smaller than the predetermined depth of the opening, and is configured to fit within the opening after attachment to the die paddle.

In yet another embodiment of the present invention, the lead tip of the electronic package includes metal and a thickness that is less than 0.025 mm.

In yet another embodiment of the present invention, the leadframe includes a leadframe strip coated with NiPdAu.

In another embodiment of the present invention, a method of making packages includes providing a leadframe strip that includes a plurality of leadframes, wherein the leadframes include a plurality of leads, etching a surface of each of the leadframes to form an opening, wherein each of the leads has a lead tip that connects to a die paddle within the opening, isolating each of the leads from the die paddle, removing the die paddle, adhering a tape to a bottom side of the leadframe strips and leads, and attaching a flip chip to each of the lead tips. The method can further include coating the leadframe strip with NiPdAu.

In yet another embodiment of the present invention, the method includes connecting a plurality of metal bumps from the flip chip to each of the lead tips.

In yet another embodiment of the present invention, the method further includes providing molded ribs to the leadframe strips.

In yet another embodiment of the present invention, the method includes creating a mold cap over the opening, thereby encapsulating the die.

In another embodiment of the present invention, an electronic package includes a leadframe having a plurality of leads, wherein each of the leads has a lead tip, an opening formed within the leadframe, a tape that is adhered to a back side of the leadframe and leads, and a flip chip, wherein the flip chip includes a plurality of metal bumps and is connected with each of the lead tips through the each of the metal bumps. The leadframe of the electronic package can also include a leadframe strip coated with NiPdAu.

In yet another embodiment of the present invention, the electronic package further includes a mold cover that encapsulates the opening.

In yet another embodiment of the present invention, the mold cover of the electronic package is selected from a group consisting of flushed mold cap, raised flat mold cap, and dome-shaped mold cap.

In yet another embodiment of the present invention, the opening of the electronic package has a predetermined depth.

In yet another embodiment of the present invention, the flip chip connected to the electronic package has a thickness that is smaller than the predetermined depth of the opening, and is configured to fit within the opening.

BRIEF DESCRIPTION OF THE DRAWINGS

These and other features, aspects, and advantages of the present invention will become better understood with regard to the following description and the accompanying drawings, which illustrate examples of the invention.

DETAILED DESCRIPTION OF THE INVENTION

Figure 1:
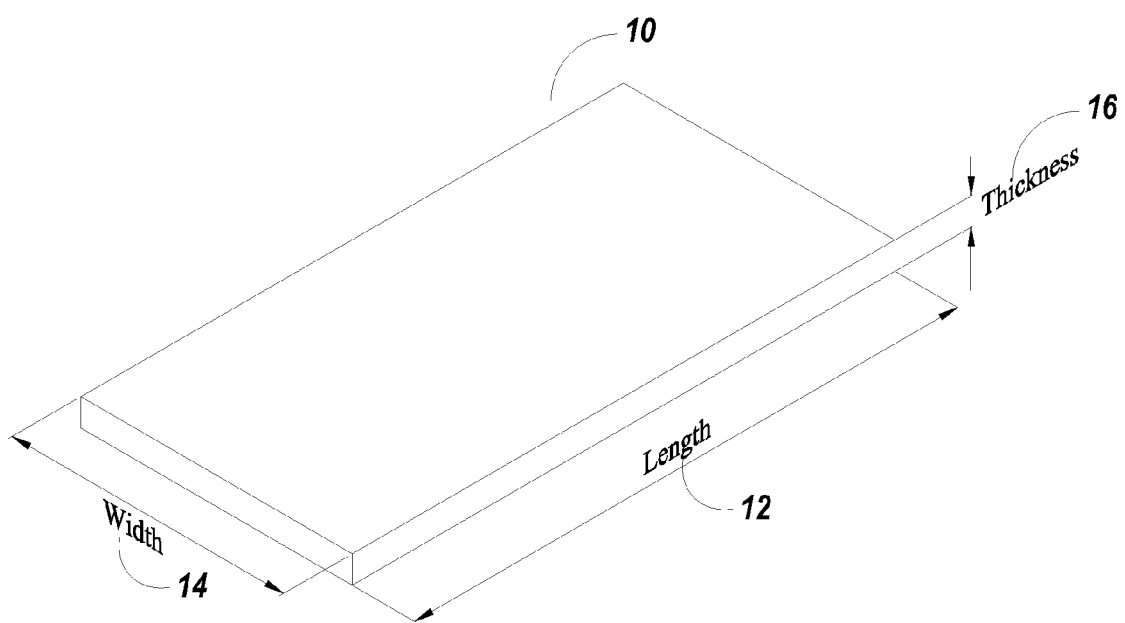
FIG. 1 is an illustration of a raw leadframe copper blank strip.

In general the present invention provides a package design and a method of manufacturing the same that provide a leadless package and reduce the thickness of the package. The embodiments of the present invention are implemented in a manner that utilizes the existing leadframe base technology, in which manufacturing can be done more efficiently, while also providing an exposed heatsink through the exposed metal die paddle. Embodiments of the present invention are sufficiently flexible for use with wire-bonded die and flip chips. As one of skill in the art will appreciate, the embodiments described herein are exemplary, and other embodiments are possible. Like reference numerals refer to the same item in different figures.

FIG. 1 is an illustration of a raw leadframe copper blank strip 10, with a given length 12, width 14, and thickness 16. The copper blank strip 10 is the starting point in the manufacture of a leadframe (not shown here). The length 12 and width 14 of the leadframe copper blank strip is flexible and is determined by production requirement. The thickness 16 of the leadframe copper blank strip can be of any desired size, as this will determine the minimum thickness of the finished product, which is the package. In a preferred embodiment, the thickness 16 is 0.2 mm. However, it should be appreciated that a thinner leadframe copper blank strip can be used if a thinner package of less than 0.2 mm is required.

Figure 2:
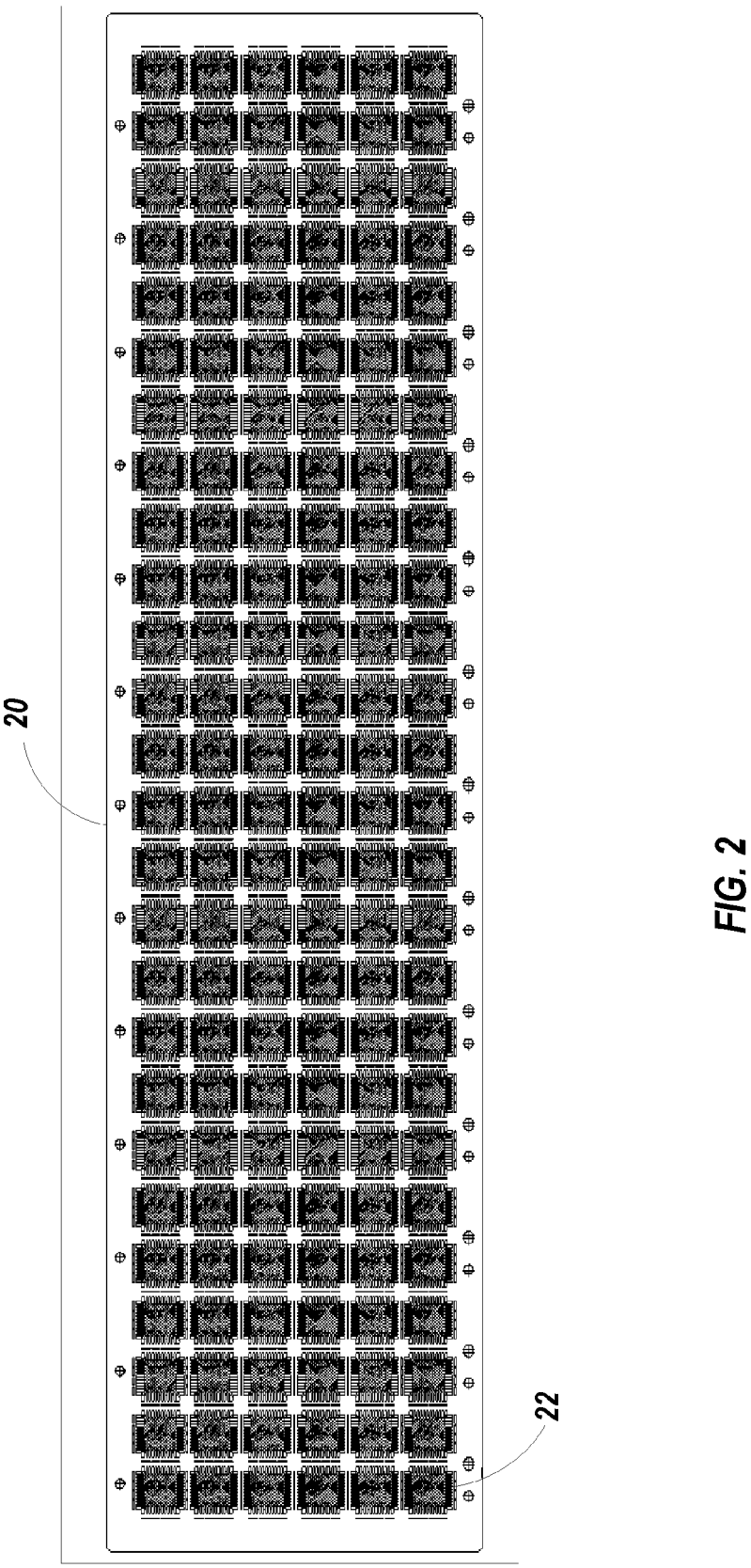
FIG. 2 is an illustration of a leadframe strip.

FIG. 2 is an illustration of a leadframe strip 20. The leadframe strip 20 comprises multiple leadframes 22. Each leadframe 22 has a particular pattern, in which the individual leadframe pattern will be etched out from the raw leadframe copper blank strip 10 in a single etch step. Additionally the leadframes 22 can be arranged in a pattern that maximizes the number of leadframes 22 that fit into the leadframe 20 and that can be processed with existing equipment. In one such arrangement the leadframes are positioned in a matrix array. In the preferred embodiment, the leadframe copper blank strip 10 will be in a reel during processing and upon completion the blank 10 will be cut to the required length 12. In other embodiments the leadframes can be cut out of the copper blanks during the reel processing.

Figure 3:
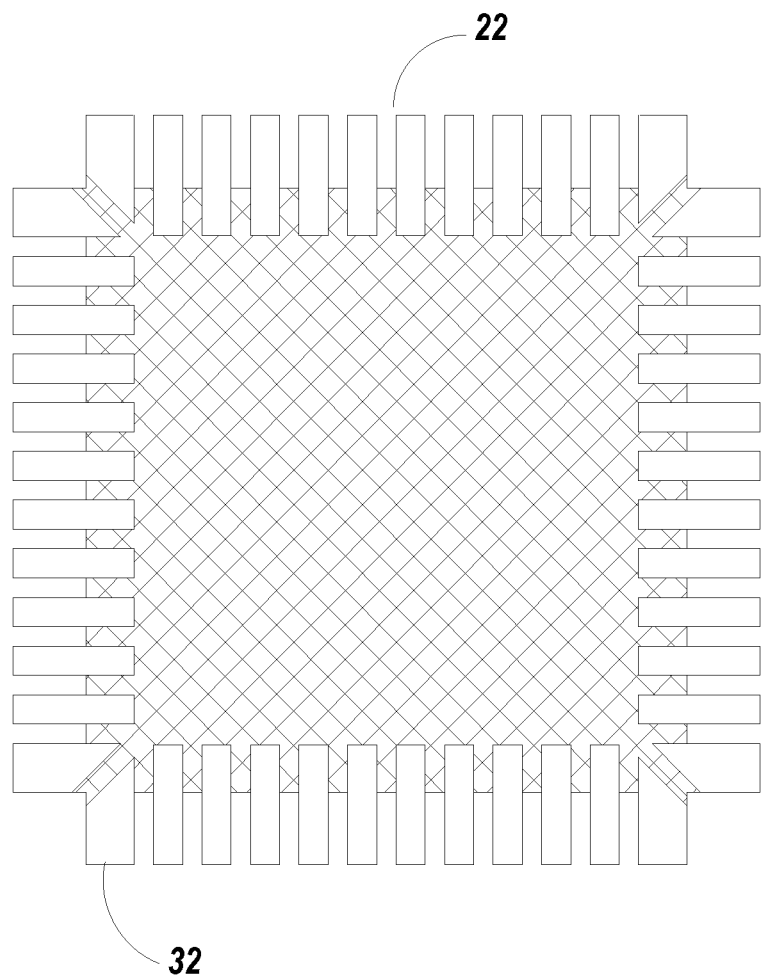
FIG. 3 is a plan view individual leadframe pattern design is critical to achieve the desired result of a thin leadless package.

FIG. 3 is a plan view of the individual leadframe 22 described in FIG. 2. The individual leadframe pattern design is used to achieve the desired result of a thin leadless package. The leadframe 22 is made of a plurality of individual leads 32. The number of individual leads 32 can vary depending on the application.

Figure 4:
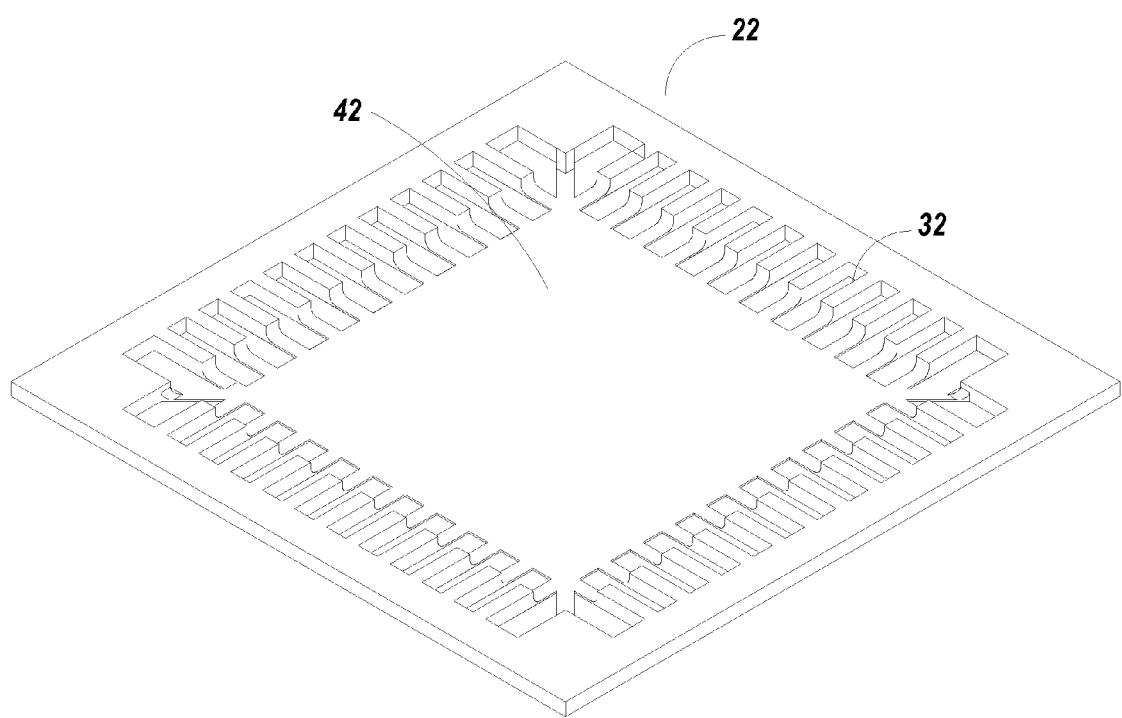
FIG. 4 is a three-dimensional view of a thin leadless package.

FIG. 4 is a three-dimensional view of a thin leadless package that has been etched to have a recessed region to position a die. By etching the leadframe 22, the resulting pattern will provide a metal die paddle 42, in which the die paddle 42 serves as a platform for attaching the chip, or die (not shown). The recessed region or die paddle can be formed by various application such dry etching or wet etching. In this embodiment, the metal die paddle 42 is joined to the individual leads 32. The metal die paddle 42 provides a heat sink since it is exposed and facilitates wire connection (e.g., gold or copper) from the chip to the leads 32, which are also exposed metal pads. For flip chip connection, the chip (die) will connect directly to the leads 32 thru metal bumps (not shown).

Figure 5:
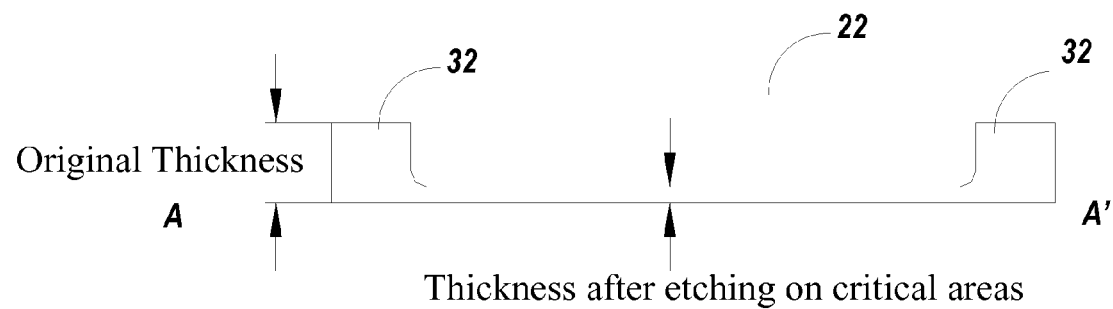
FIG. 5 is a cross section view of the individual leadframe illustrated in FIG. 4 after etching, in accordance with one embodiment of the invention.

FIG. 5 is a cross-sectional view of the individual leadframe 22 illustrated in FIG. 4 after etching, in accordance with one embodiment of the invention. In the preferred embodiment, the area of the individual leadframe 22 that makes up the metal die paddle 42 and the individual leads 32 is etched so that a metal thickness less than 25 microns remains after etching. At this stage, the leadframe strip 20 is also plated with NiPdAu or equivalent material to prepare the areas making up the metal die paddle 42 and the individual leads 32 for the eventual chip connection. In one embodiment the individual leadframe 22 is etched so that the round corner is formed between the die paddle 42 and the individual lead 32, as illustrated. In another embodiment a sharp inside edge is formed between the die paddle and the individual lead 32 (not shown). The view along A-A' is illustrated in FIG. 6.

FIGS. 6-13 illustrate leadframe preparation prior to assembly.

Figure 6:
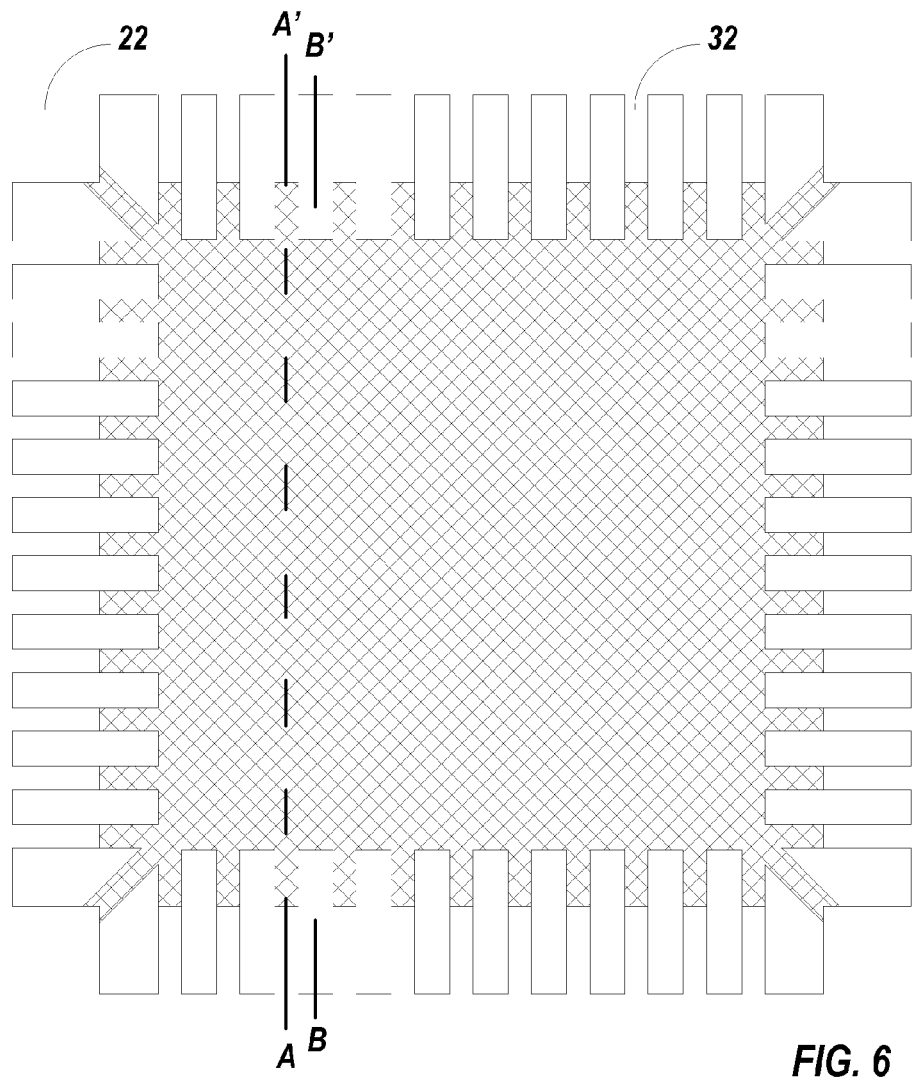
FIG. 6 is a plan view of the individual leadframe illustrated in FIG. 5 before isolation, in accordance with one embodiment of the invention.

FIG. 6 is a plan view of the individual leadframe 22 illustrated in FIG. 5 before isolation, in accordance with one embodiment of the invention. At this point, the leadframe 22 has been etched and plated as described above. The cross section of this plan view is illustrated in FIG. 5 and the view along line A-A' is depicted.

Figure 7:
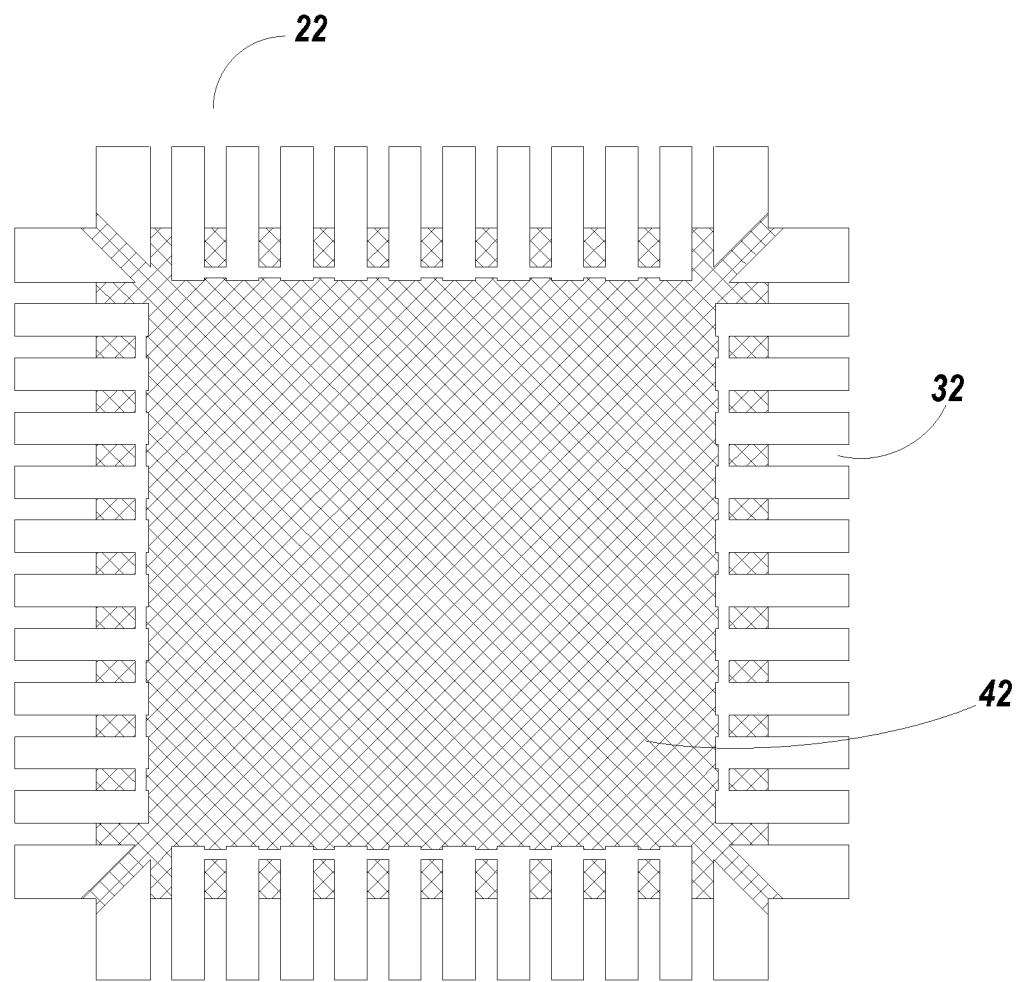
FIG. 7 is a plan view of the individual leadframe illustrated in FIG. 6 after lead isolation, in accordance with one embodiment of the invention.

FIG. 7 is a plan view of the individual leadframe 22 illustrated in FIG. 6 after lead isolation, in accordance with one embodiment of the invention. A tool is used to isolate the leads 32 from the die paddle 42 or to remove the die paddle 42 completely for flip chip attachment. The tool mechanically punches out the metal between the leads 32 and the die paddle 42. The tool is also used to define the exposed lead length and the exposed die paddle 42 of the package.

Although the operations illustrated in FIGS. 1-7 can be performed as part of the lead frame packaging process, these operations can also be performed by a leadframe supplier so that leadframes with the described shape are sent to the packaging operations prepared for subsequent chip assembly.

Figure 8:
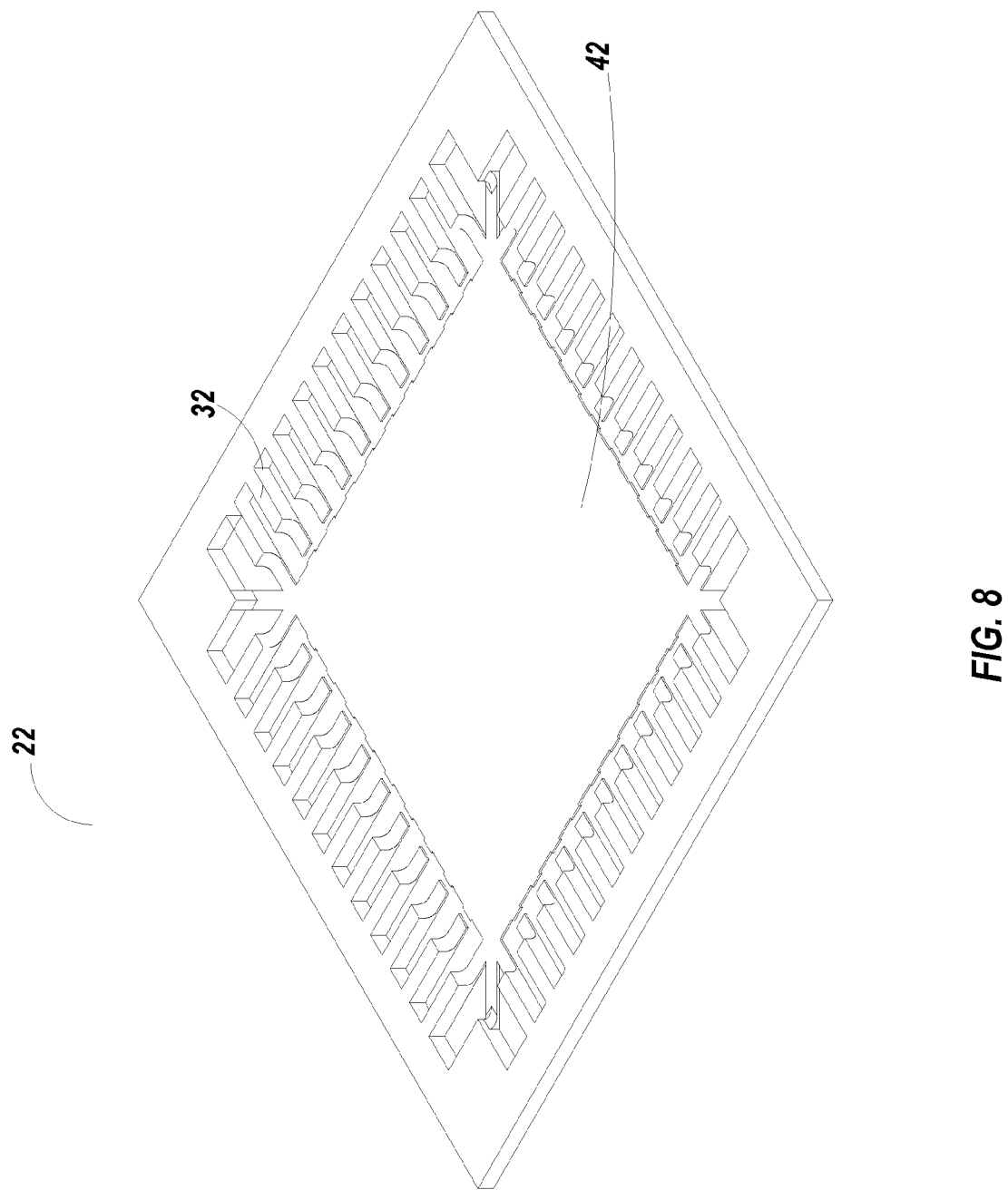
FIG. 8 is a three-dimensional view of the individual leadframe illustrated in FIG. 7 after lead isolation, in accordance with one embodiment of the invention.

FIG. 8 is a three-dimensional view of the individual leadframe illustrated in FIG. 7 after lead isolation, in accordance with one embodiment of the invention.

Figure 9:
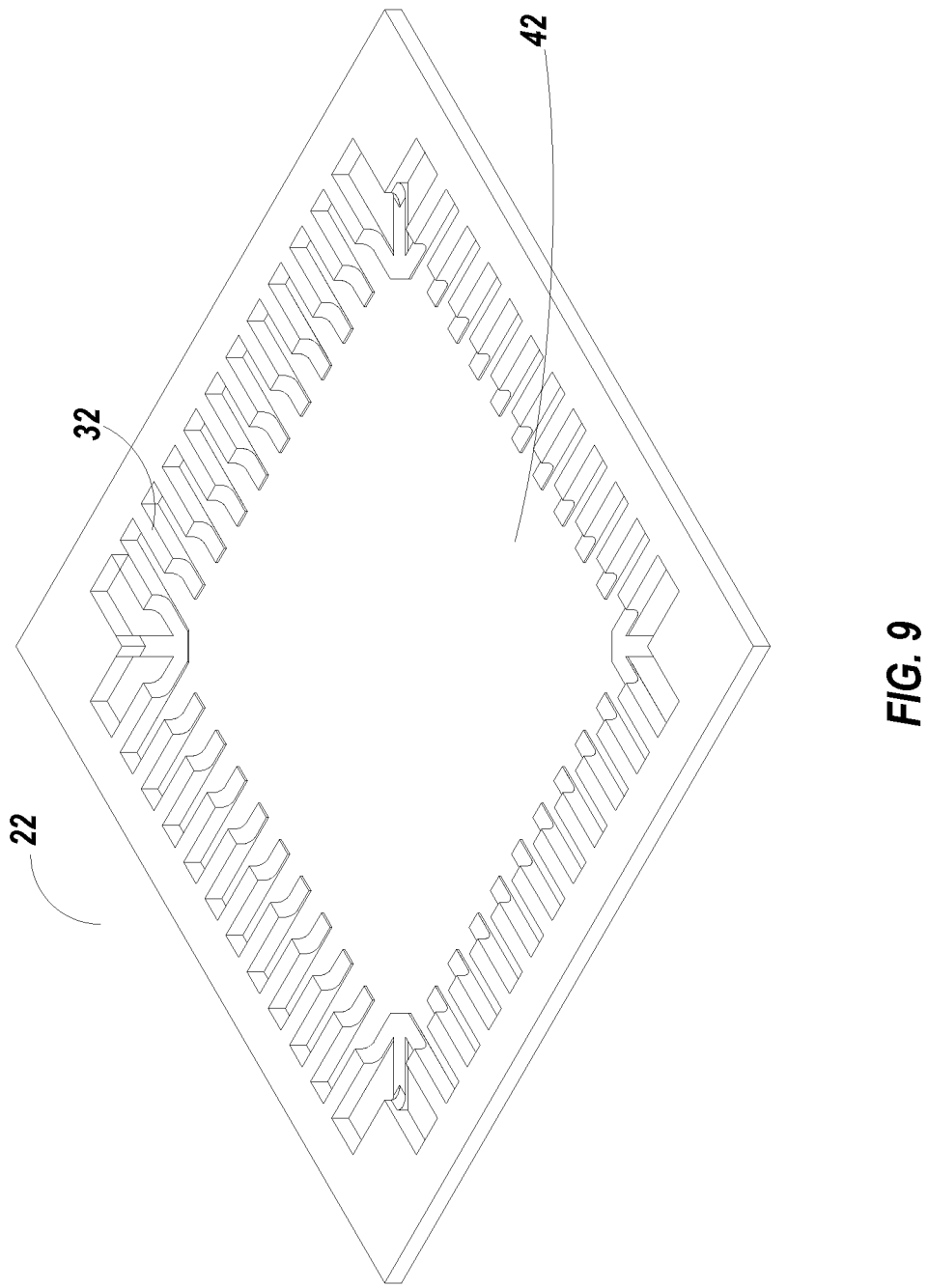
FIG. 9 is a three-dimensional view of the individual leadframe illustrated in FIG. 8 after die paddle removal, in accordance with one embodiment of the invention.

FIG. 9 is a three-dimensional view of the individual leadframe illustrated in FIG. 8 after die paddle removal, in accordance with one embodiment of the present invention.

Figure 10:
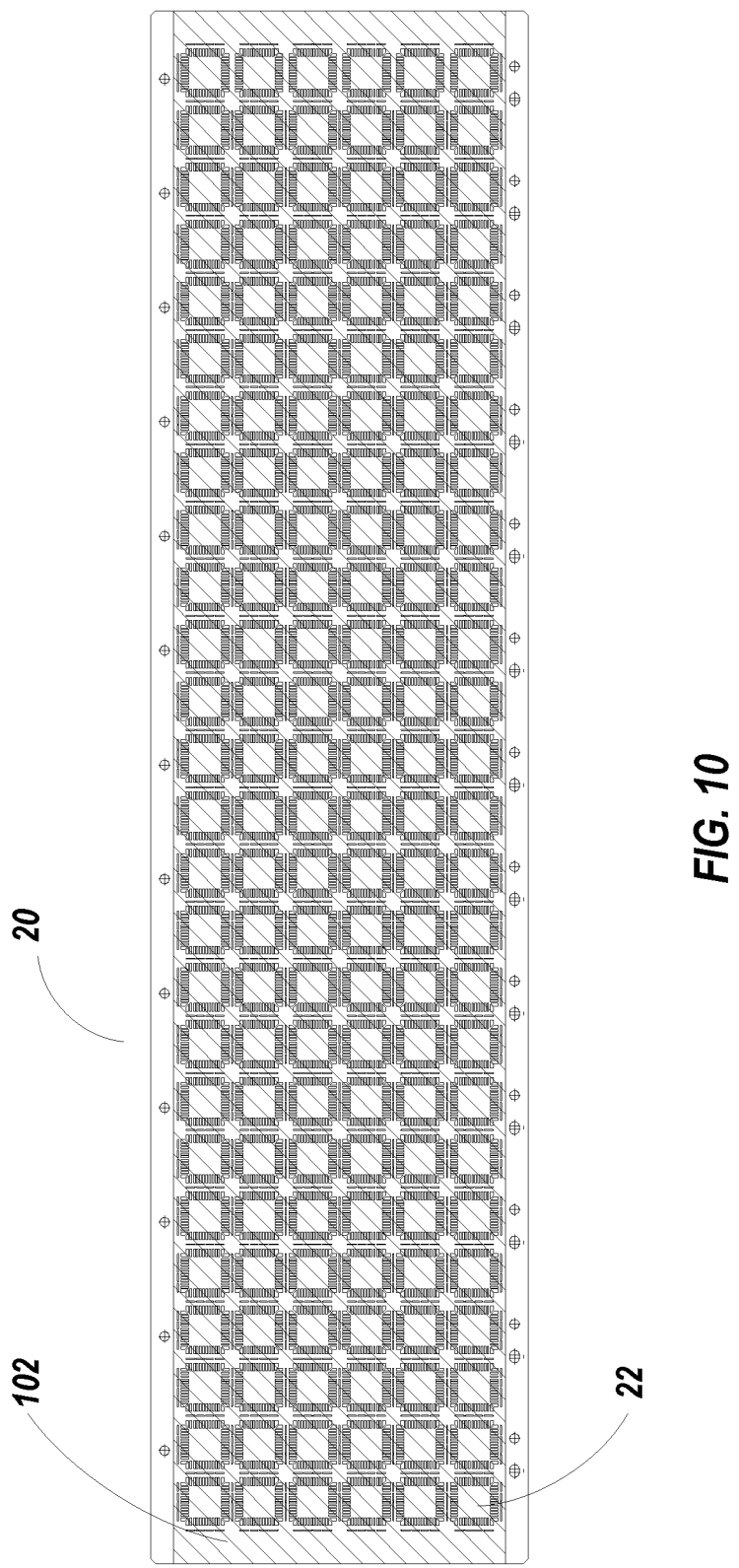
FIG. 10 is a bottom view of a leadframe strip that is taped with polymide tape or equivalent, in accordance with one embodiment of the invention.
Figure 11:
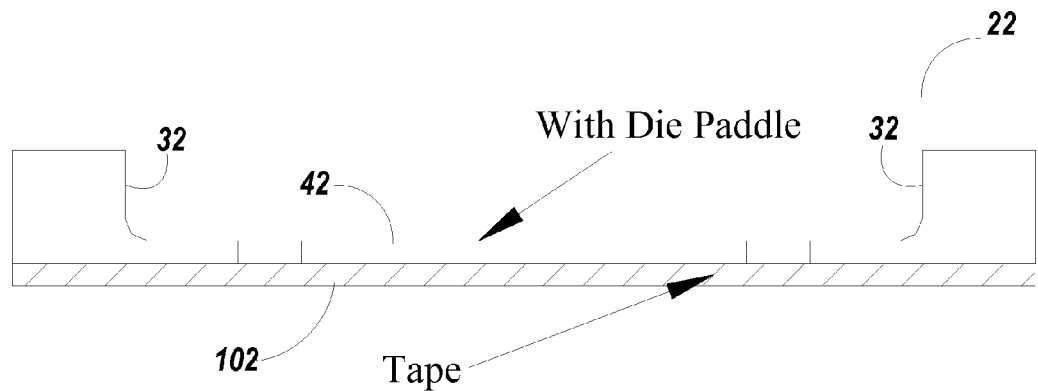
FIG. 11 is a cross section view of individual leadframe after taping with lead isolation, in accordance with one embodiment of the invention.
Figure 12:
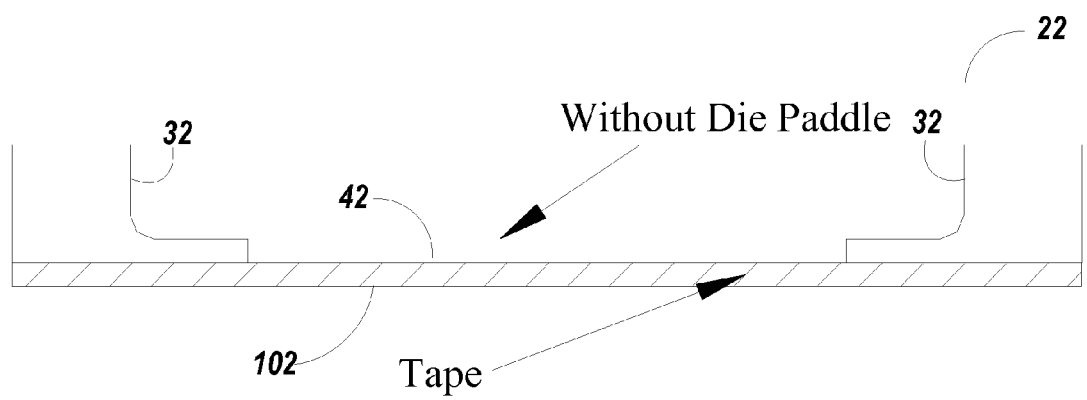
FIG. 12 is a cross section view of individual leadframe after taping with lead isolation with the die paddle removed, in accordance with one embodiment of the invention.

FIG. 10 is a bottom view of the leadframe strip 20 after the lead isolation. In this embodiment of the present invention, the bottom of the leadframe strip 20 is taped with polymide tape 102, or equivalent type of material, where the exposed leads 32 (metal pad) and exposed die paddle 42. FIGS. 11-12 illustrate further details of the polymide tape 102 attached to the leadframe strip 20.

FIG. 11 is a cross-sectional view of individual leadframe 22 after lead isolation and taping, in accordance with an embodiment of the present invention. In one embodiment of the invention, a tape 102 is attached to the bottom of the leadframe 22 before the die paddle 42 is removed. The tape 102 can be used to support the leads from being damaged in subsequent processes. Supporting the leads with tape 102 can be advantages in applications where the leads are flimsy after they have been isolated in the lead isolation process.

FIG. 12 is a cross section view of individual leadframe 22 after lead isolation and taping with the die paddle removed, in accordance with an embodiment of the present invention. In this embodiment, the die paddle 42 is first removed from the leadframe 22 and then the tape 102 is applied to the bottom of the leadframe 22. As with the embodiment illustrated in FIG. 11, the tape 102 can be used to support the leads from being damaged in subsequent processes. As described above with reference to FIG. 11, supporting the leads with tape 102 can be advantages in applications where the leads are flimsy after they have been isolated in the lead isolation process.

Figure 13:
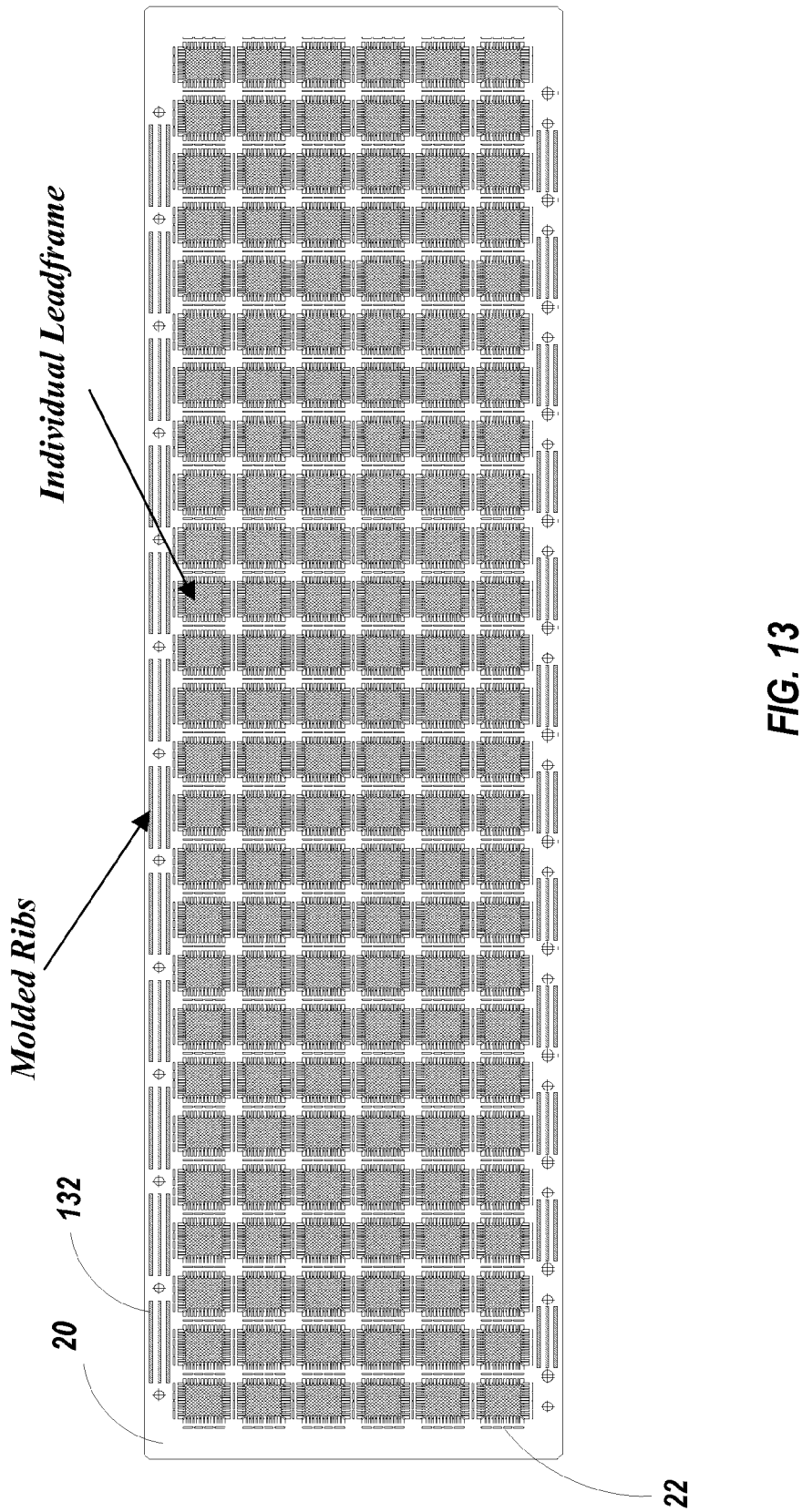
FIG. 13 is a plan view of leadframe strip with molded ribs, in accordance with one embodiment of the invention.

FIG. 13 is a plan view of leadframe strip 20, in accordance with another embodiment of the present invention. The leadframe strip 20 has molded ribs 132 along the sides to add rigidity to its overall structure. This step of adding molded ribs is optional, depending on the leadframe strip rigidity requirements. This step would involve molding plastic ribs on strategic locations on the leadframe strip.

FIGS. 14-29 illustrate the assembly of the leadframe.

Figure 14:
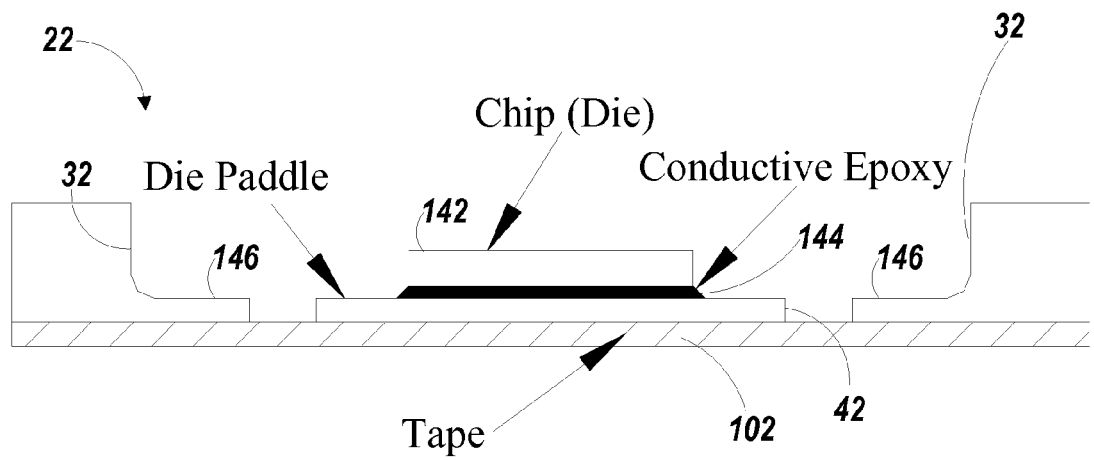
FIG. 14 is a cross section view of individual leadframe with a chip attached, in accordance with one embodiment of the invention.

FIG. 14 is a cross-sectional view of individual leadframe 22 with a chip 142 attached, in accordance with an embodiment of the present invention. A layer of conductive epoxy 144 (or like adhesive material) is applied to the backside of the chip (or die) 142 to affix it 142 to the die paddle 42. The epoxy 144 can be in the form of a film or can be screen printed onto the die paddle 42, so that the epoxy bond line thickness can be better controlled, thereby controlling the overall height of the package. The chip (die) 142 is then picked and placed onto the die paddle of the individual leadframe using die bonder equipment. This arrangement is to set up electrical connection between the chip 142 and lead tips 146 of the individual leads, and this arrangement will be further described in connection with FIG. 18.

In one embodiment, the present invention can be used to manufacture a package that has a thickness of 0.2 mm or less. To meet this requirement, the chip (die) needs to be processed to a maximum thickness of 0.050 mm.

Figure 15:
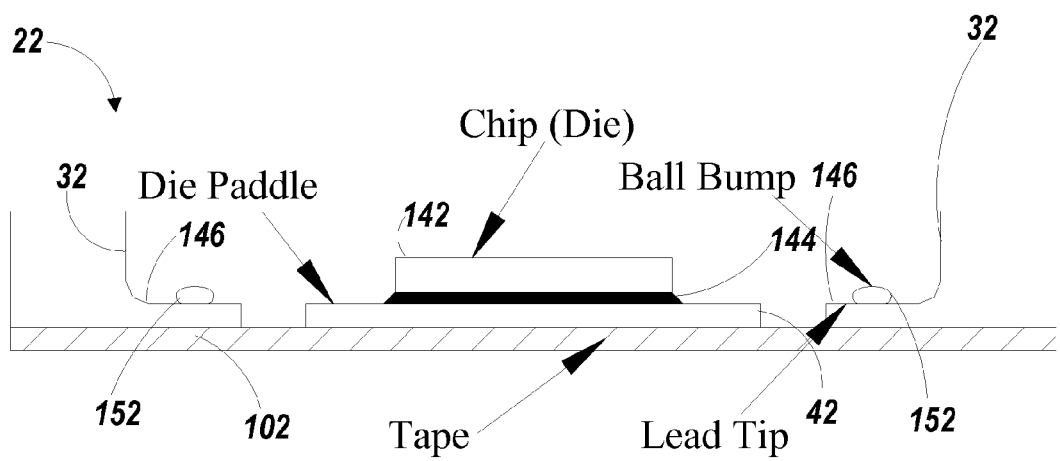
FIG. 15 is a cross section view of an individual leadframe with ball bumps on lead tips, in accordance with one embodiment of the invention.

FIG. 15 is a cross-sectional view of an individual leadframe 22 with ball bumps 152 on lead tips 146, in accordance with another embodiment of the invention. The addition of ball bumps 152 to the lead tips 146 depends on the flatness of the lead tip surface for wire bonding. In other words, the addition of the ball bumps 152 is optional. Ball bumps 152 are placed on the lead tips 146 using wire bonding machine to provide a flat surface for subsequent wire connection between the chip 142 and the leads 32. Ball bumps 152 can be made of different materials such as gold or copper.

Figure 16:
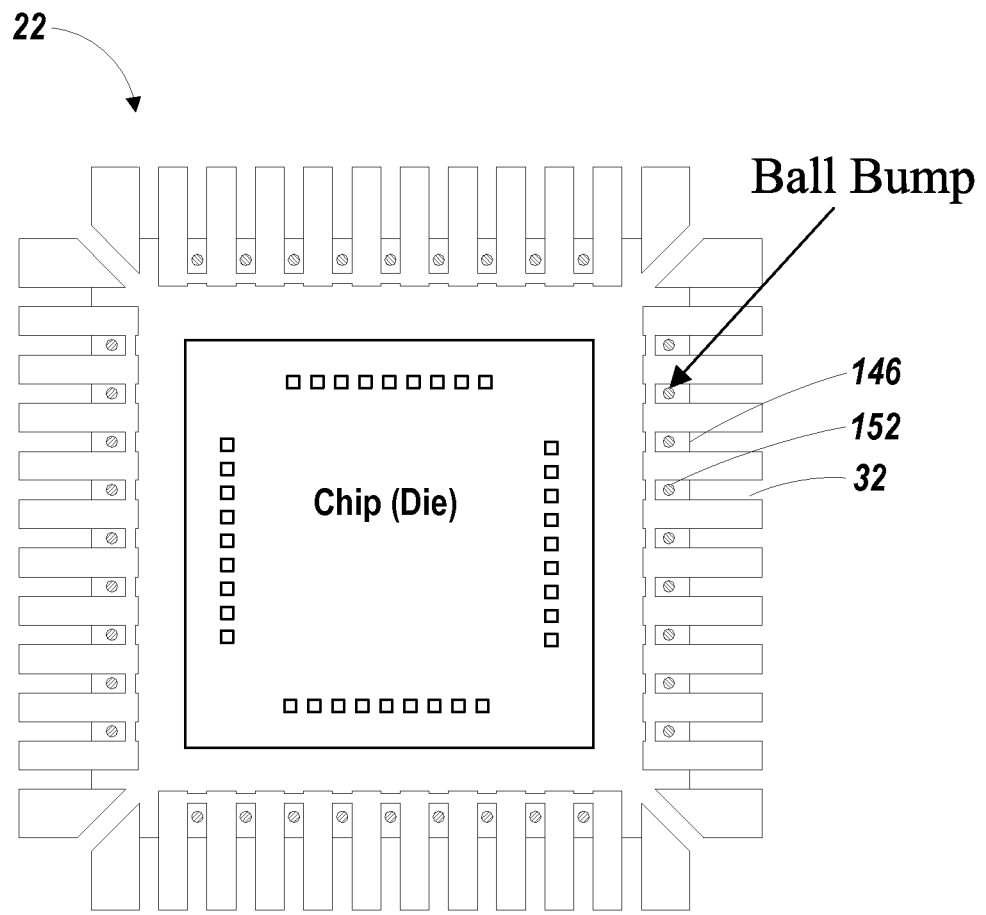
FIG. 16 is a plan view of an individual leadframe with ball bumps on lead tips, in accordance with one embodiment of the invention.

FIG. 16 is a plan view of an individual leadframe 22 with ball bumps 152 on lead tips 146 located on individual leads 32, in accordance with one embodiment of the present invention.

Figure 17:
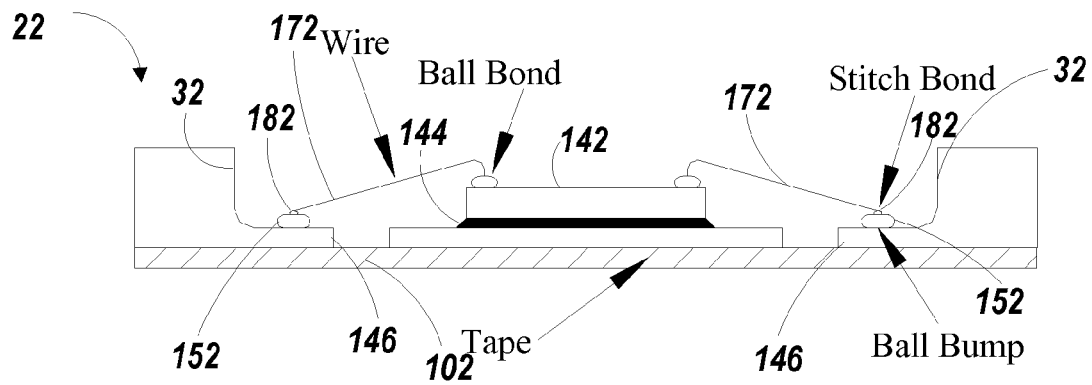
FIG. 17 is a plan view of an individual leadframe with a chip that is wire connecting to the lead tips, in accordance with one embodiment of the invention.

FIG. 17 is a plan view of an individual leadframe 22 with a chip 142 that is wire-connected to the lead tips 146, in accordance with another embodiment of the invention. The wire 172 is used to facilitate electrical connection between the chip 142 and the lead tips 146. The wire 172 is connected via the wire-bonding process. Depending on the application, the wire is preferably gold and can also be aluminum. Either a ball or a stitch is placed on the ball bump during the wire-bonding process depending on the mode of bonding to achieve a minimum loop height. In this embodiment, one end of the wire 172 is connected to the chip 142 through a ball bump while the other end of the wire is connected to the lead tips 146 through a stitch bond 182 placed on each of the ball bumps 152 during the wire-bonding process.

Figure 18:
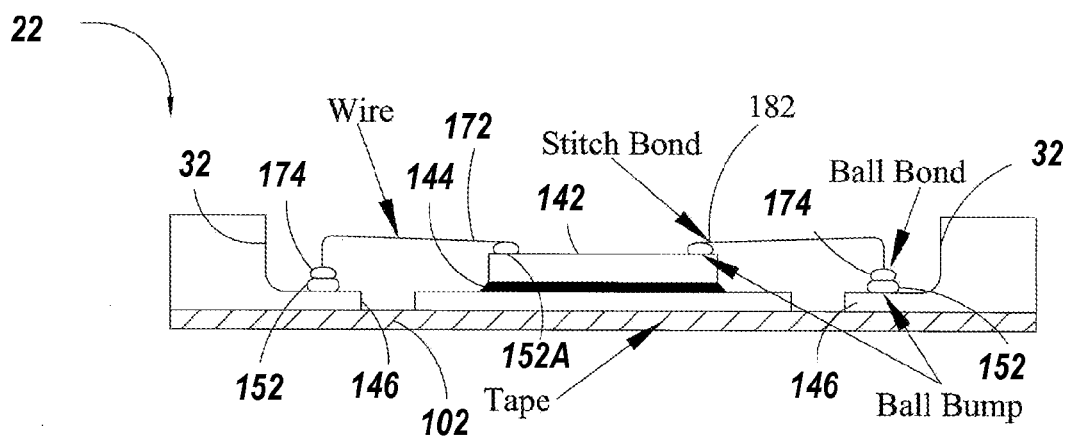
FIG. 18 is a cross section view of an individual leadframe with a chip that is wire connected to the lead tips, in accordance with one embodiment of the invention.

FIG. 18 is a cross-sectional view of an individual leadframe 22 with a chip 142 that is wire-connected to the lead tips 146 through the ball bumps 152, in accordance with an embodiment of the present invention. As with the embodiment illustrated in FIG. 17, the wire 172 is used to facilitate electrical connection between the chip 142 and the lead tips 146, and it 172 is connected via the wire-bonding process. Depending on the application, the wire is preferably gold or copper and can also be aluminum. Either a ball or a stitch is placed on the ball bump during the wire-bonding process depending on the mode of bonding to achieve a minimum loop height. FIG. 18 shows an embodiment in which an additional ball bump 152A is placed on the chip and a ball 174 is used and placed on each of the ball bumps 152 while the other end of the wire is connected to the chip through a stitch bond 182 placed on each ball bump 152A during wire-bonding. FIGS. 18, 21, 23, and 25 illustrate additional embodiments that include ball bump 152A and stitch bond 182.

Figure 19:
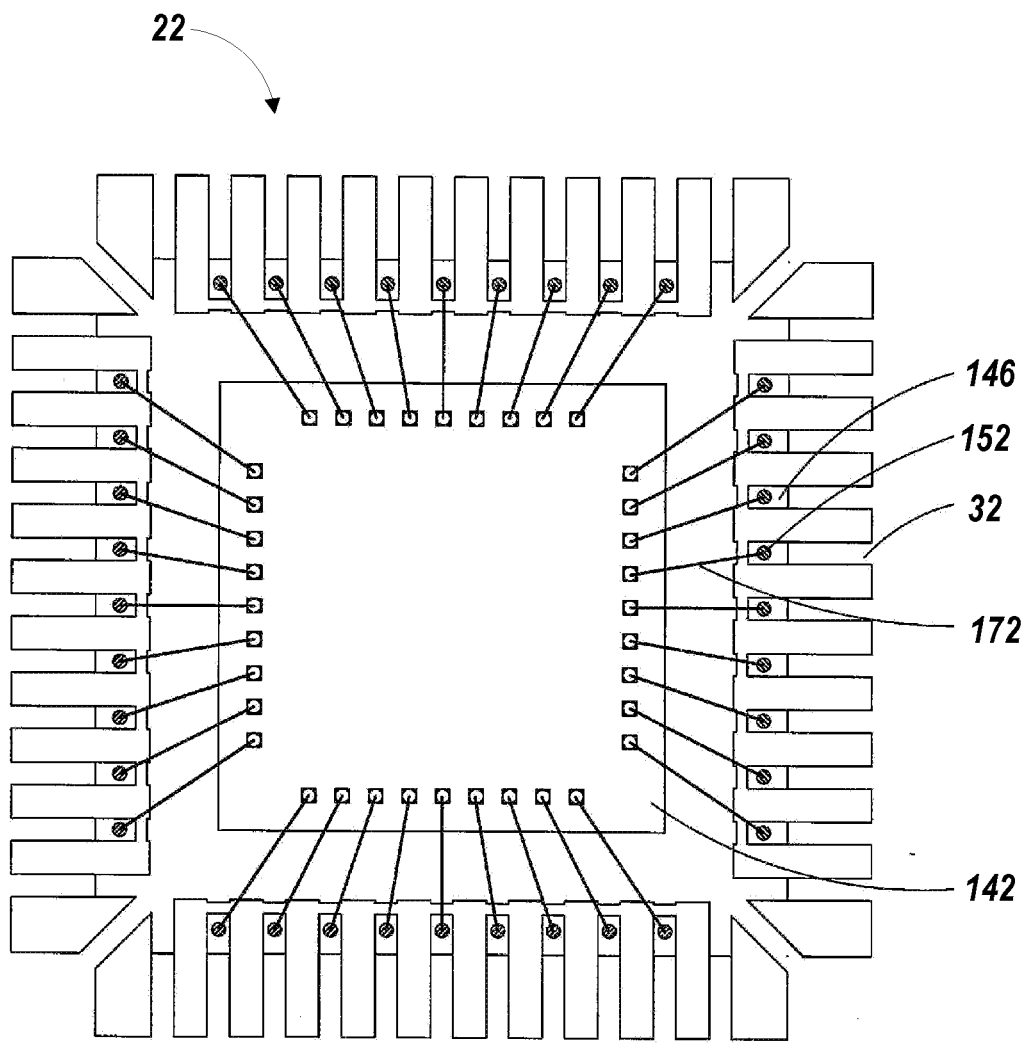
FIG. 19 is a plan view of an individual leadframe with wires connecting the chip to the lead tips, in accordance with one embodiment of the invention.

FIG. 19 is a plan view of an individual leadframe 22 with wires 172 connecting the chip 142 to the lead tips 146, in accordance with one embodiment of the present invention. The wires 172 are connected via wire bonding to the ball bumps 152 on lead tips 146 of the individual leads 32 as described above with reference to FIGS. 17 and 18.

Figure 20:
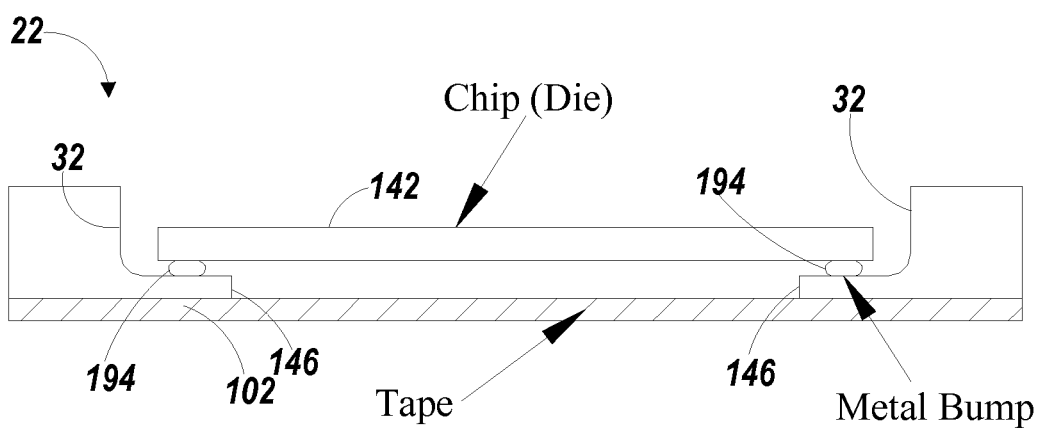
FIG. 20 is a cross section view of individual leadframe after flip chip, in accordance with one embodiment of the invention.

FIG. 20 is a cross-sectional view of an individual leadframe 22 after flip chip attachment, in accordance with another embodiment of the invention. When attaching a flip chip 192, it preferably uses a leadframe 22 with the die paddle 42 removed, as described in connection with FIGS. 9 and 12. The flip chip 192 is bonded to the lead tips 146 through its metal bumps 194 with the use of a flip chip bonder. The metal bump, which can be gold or copper, can be applied by thermo-sonic bonding or reflow with solder paste.

Figure 21:
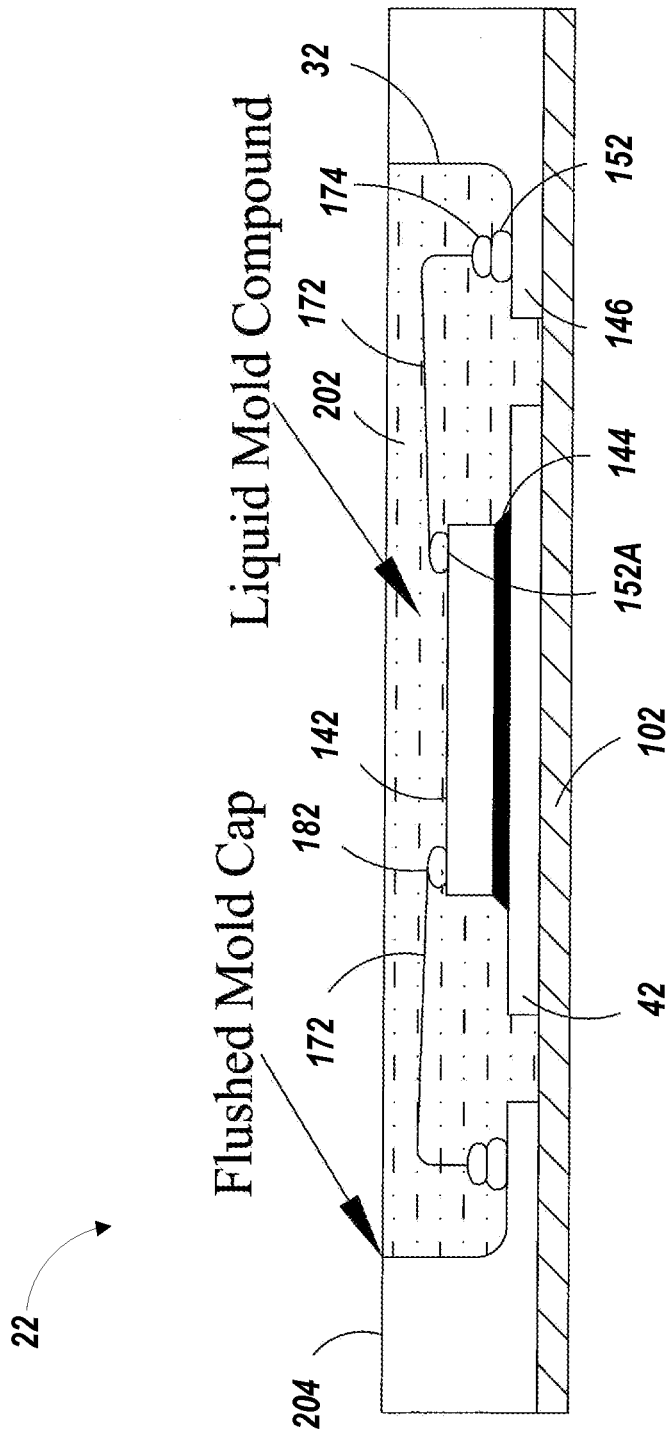
FIG. 21 is a cross section view of an individual leadframe after encapsulation, in accordance with one embodiment of the invention.

FIG. 21 is a cross-sectional view of an individual leadframe 22 after encapsulation, in accordance with yet another embodiment of the present invention. The chip (die) 142 and wires 172 are then protected from the environment by encapsulating the chip 142 and the wires 172 with a liquid mold compound. (In an alternative embodiment, the flip chip 192 and its metal bumps 194 can be encapsulated with the same type of liquid mold compound for environmental protection.) A black or clear liquid mold compound can be used depending on the application. For example, a clear liquid mold compound will be used for an optical application. After the liquid mold compound dries and solidifies, it becomes a mold cap 202. FIG. 21 shows the mold cap 202 that is flushed with the top 204 of the leadframe 22. This embodiment is best suited for manufacturing the thinnest possible package, such as one that has a thickness of 0.2 mm or less. It should be appreciated that the mold cap 202 can be in different thicknesses and configuration as will be described in FIGS. 23-26.

Figure 22:
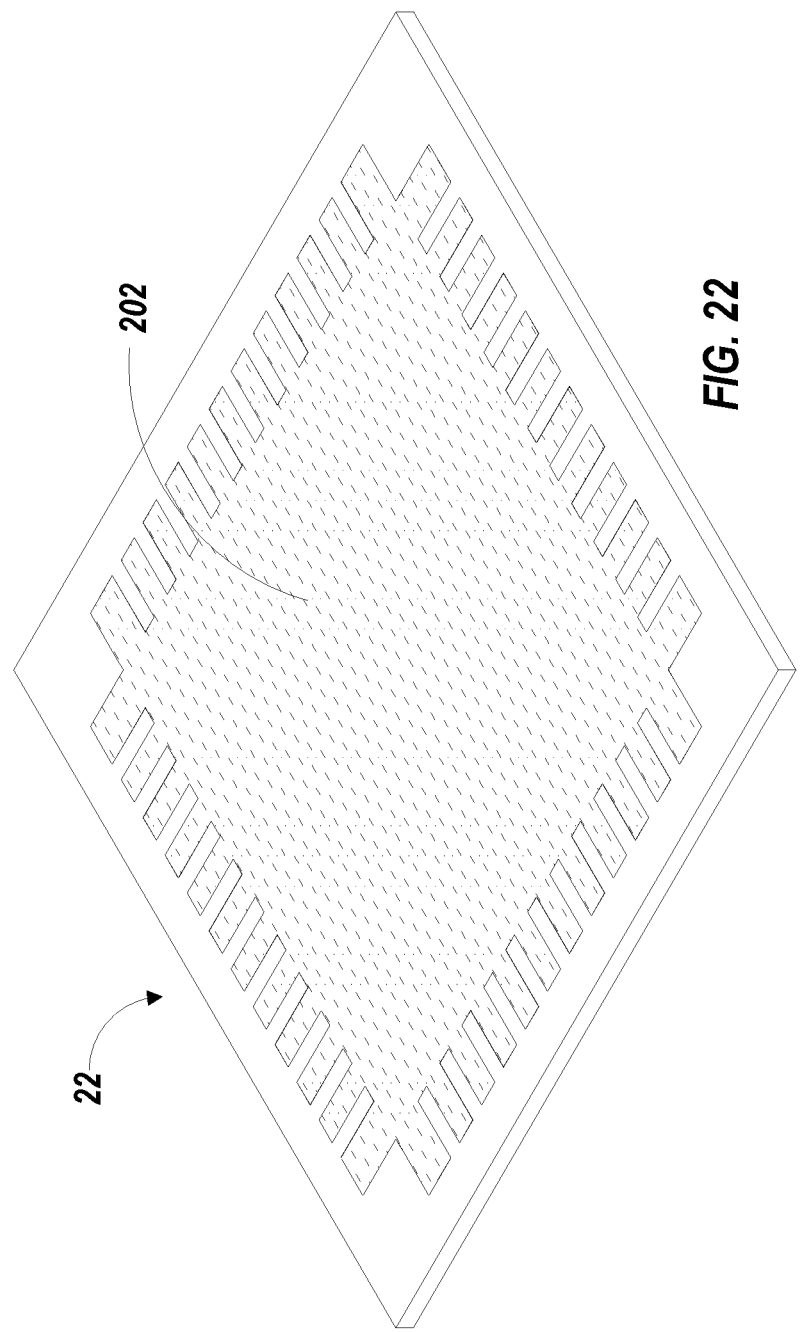
FIG. 22 is a three-dimensional view of an individual leadframe after encapsulation, in accordance with one embodiment of the invention.

FIG. 22 is a three-dimensional view of an individual leadframe 22 after encapsulation, in accordance with an embodiment of the present invention.

Figure 23:
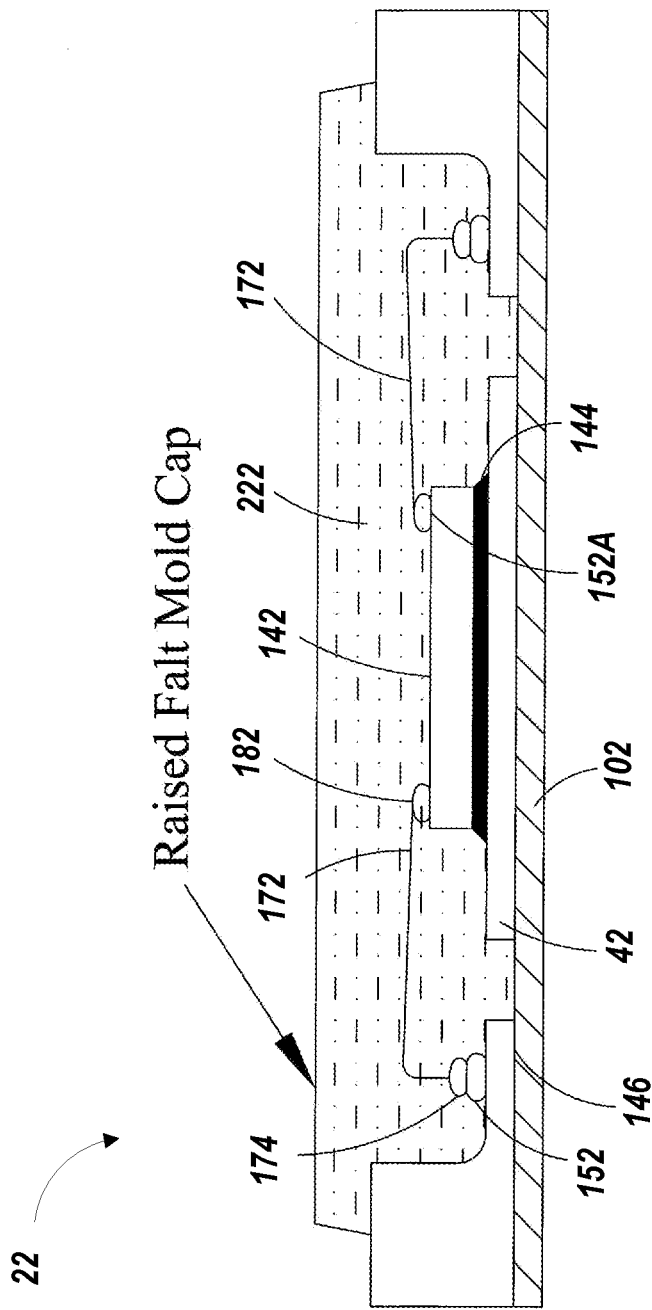
FIG. 23 is a cross section view of an individual leadframe with raised flat mold cap, in accordance with one embodiment of the invention.

FIG. 23 is a cross-sectional view of an individual leadframe 22 with a raised flat mold cap 222, in accordance with one embodiment of the present invention. The raised flat mold cap 222 is raised over the top of the leadframe 22. The raised flat mold cap 222 is suitable to create packages that are thicker, such as one that has a thickness greater than 0.2 mm. For example, this embodiment may be useful when the chip (die) 142 is thicker. This embodiment provides some flexibility in applications where the chip (die) 142 thickness is more than 0.050 mm but less than 0.100 mm. In these applications the mold cap can be raised by 0.050 mm.

Figure 24:
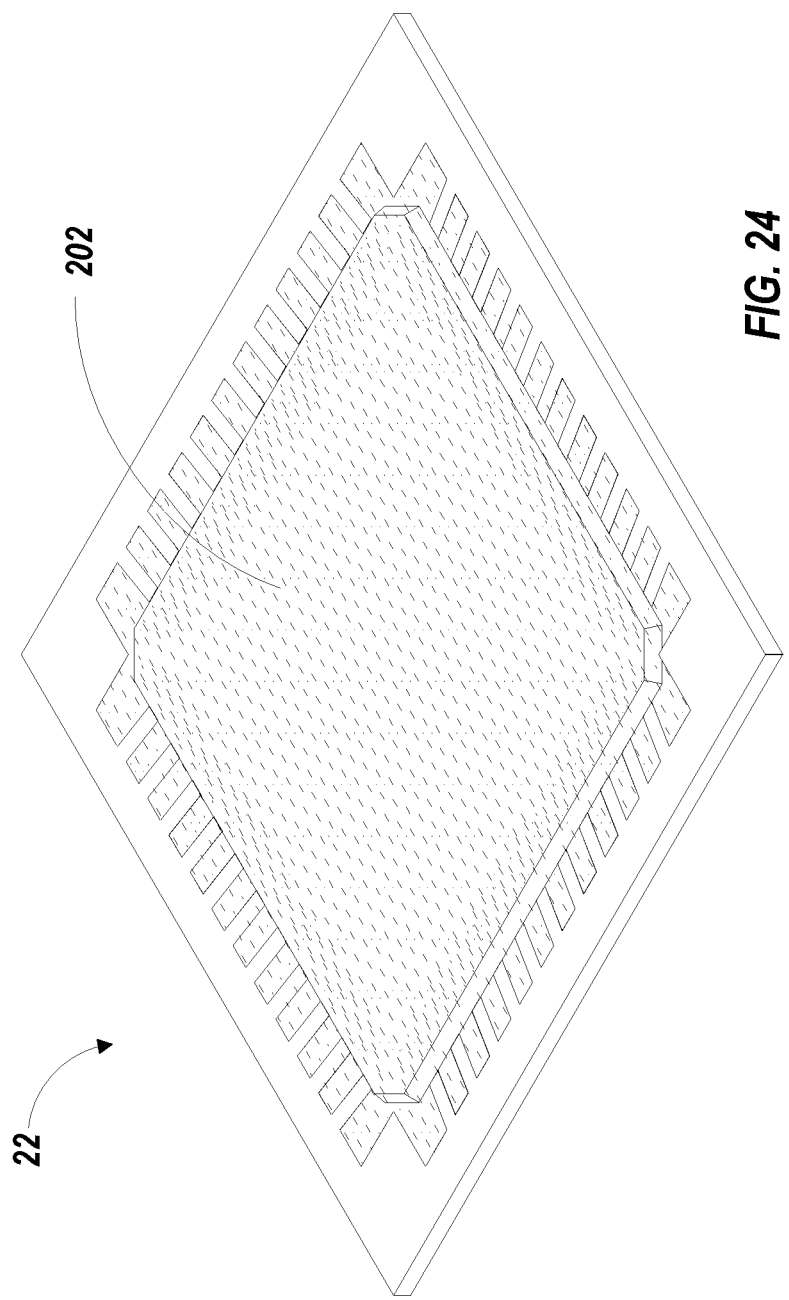
FIG. 24 is a three-dimensional view of an individual leadframe with raised flat mold cap, in accordance with one embodiment of the invention.

FIG. 24 is a three-dimensional view of an individual leadframe 22 with raised flat mold cap 222, in accordance with an embodiment of the present invention.

Figure 25:
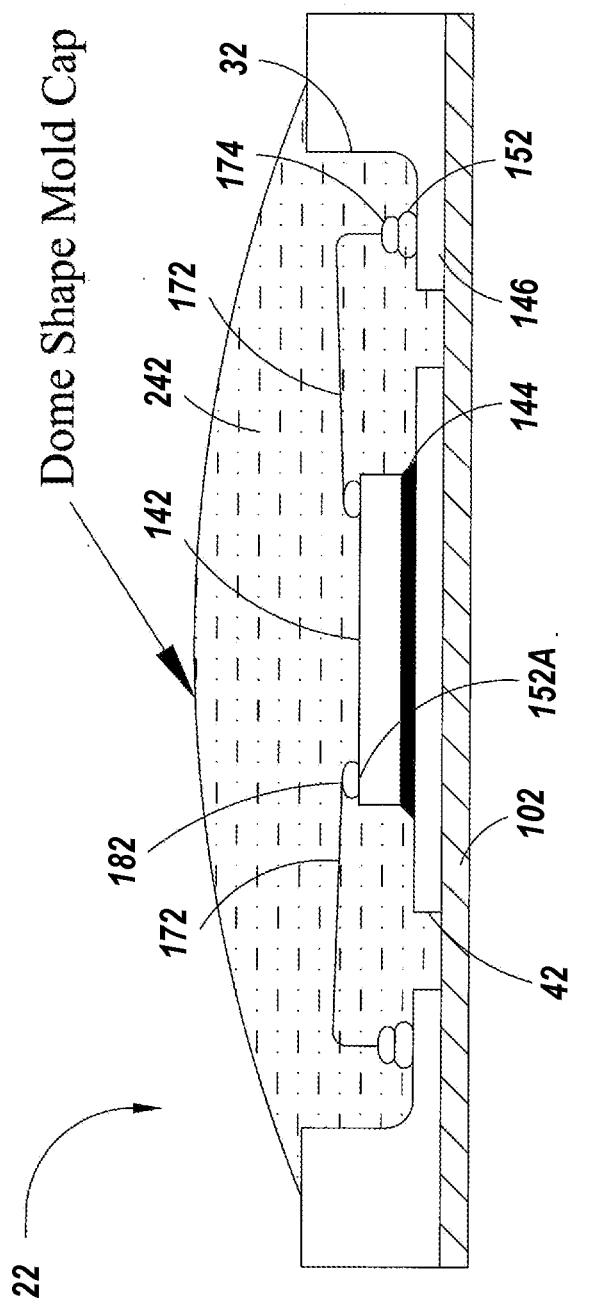
FIG. 25 is a cross section view of an individual leadframe with a dome shape mold cap, in accordance with one embodiment of the invention.

FIG. 25 is a cross-sectional view of an individual leadframe 22 with a dome-shaped mold cap 242, in accordance with another embodiment of the present invention. The dome-shaped mold cap 242 also is raised over the top of the leadframe 22. The dome-shaped mold cap 242 is suitable to create packages that are thicker, such as one that has a thickness greater than 0.2 mm. The dome-shaped mold cap 242 is also more suitable for packages with optical applications.

Figure 26:
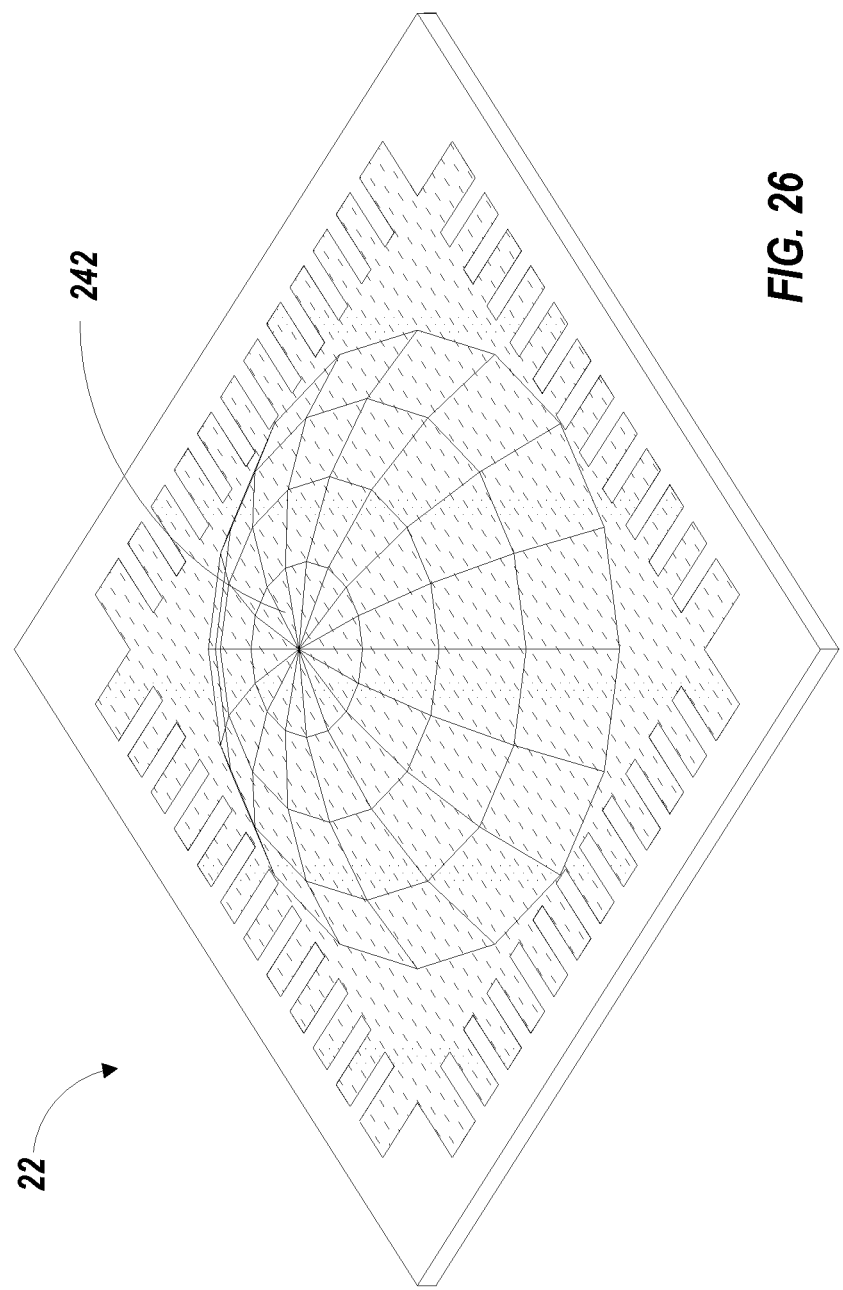
FIG. 26 is a three-dimensional view of an individual leadframe with a dome shape mold cap, in accordance with one embodiment of the invention.

FIG. 26 is a three-dimensional view of an individual leadframe 22 with a dome-shaped mold cap 242, in accordance with an embodiment of the present invention.

Figure 27:
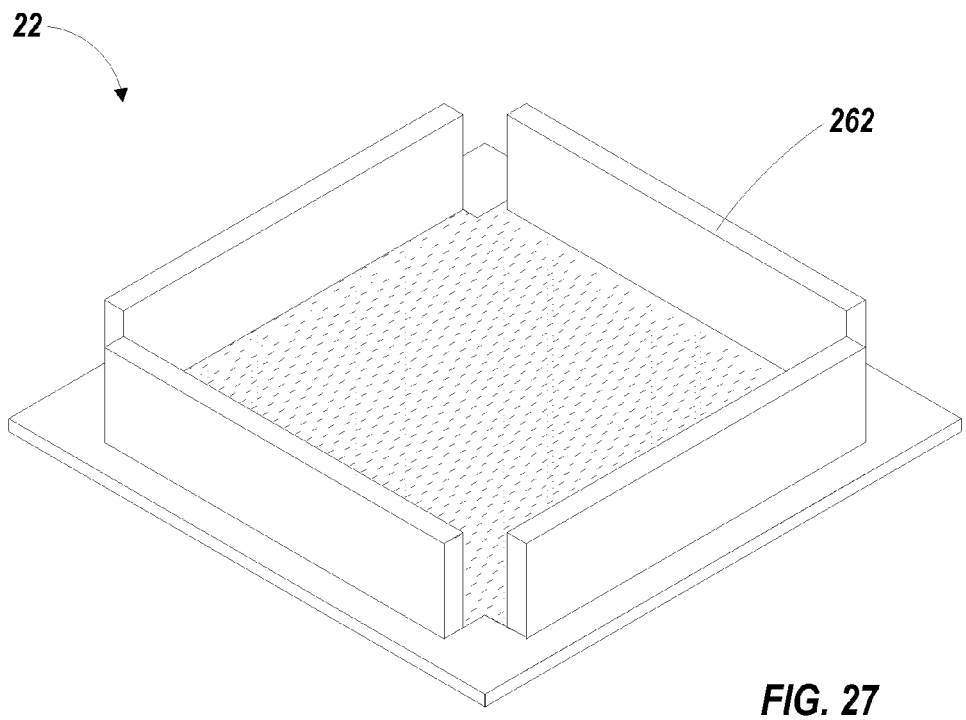
FIG. 27 is a three-dimensional view of an individual leadframe lead cut, in accordance with one embodiment of the invention.

FIG. 27 is a three-dimensional view of an individual leadframe 22 lead cut, in accordance with one embodiment of the present invention. After encapsulation, the leadframe strip 20 is then singulated, causing the individual leadframes 22 to separate physically from each other. One of skill in the art will recognize the appropriate specialized tools to singulate the leadframe strip 20. FIG. 27 specifically shows the use of a lead cut punch 262 along each of the sides of the leadframe 22.

Figure 28:
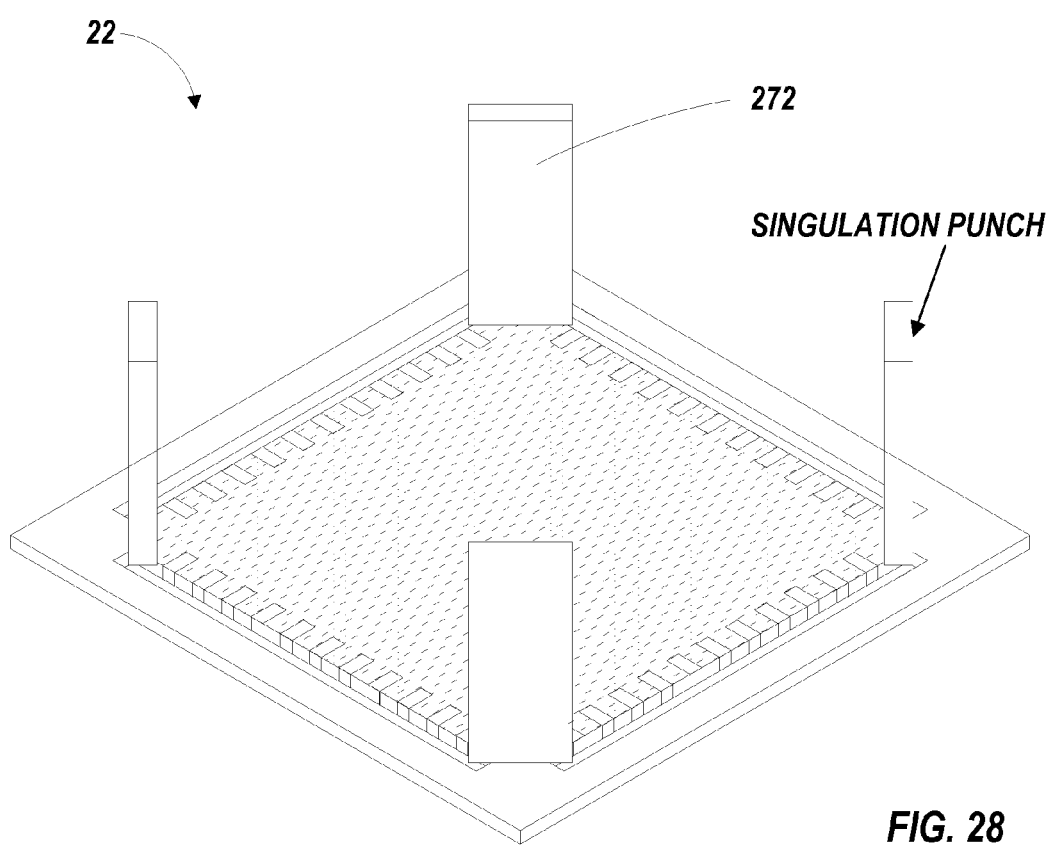
FIG. 28 is a three-dimensional view of an individual leadframe singulated, in accordance with one embodiment of the invention.

FIG. 28 is a three-dimensional view of an individual leadframe 22 singulated, in accordance with another embodiment of the present invention. In this embodiment, FIG. 28 specifically shows the use of a singulation punch 272 along each of the sides of the leadframe 22.

Singulation of an individual molded package includes 2 steps. Firstly, a singulation punch 262 (FIG. 27) along each of the sides of the leadframe 22 is carried out to separate the leads from the leadframe. Next, a singulation punch 272

(FIG. 28) along each of the corners of the leadframe is carried out to separate the tie bars from the leadframe.

Figure 29:
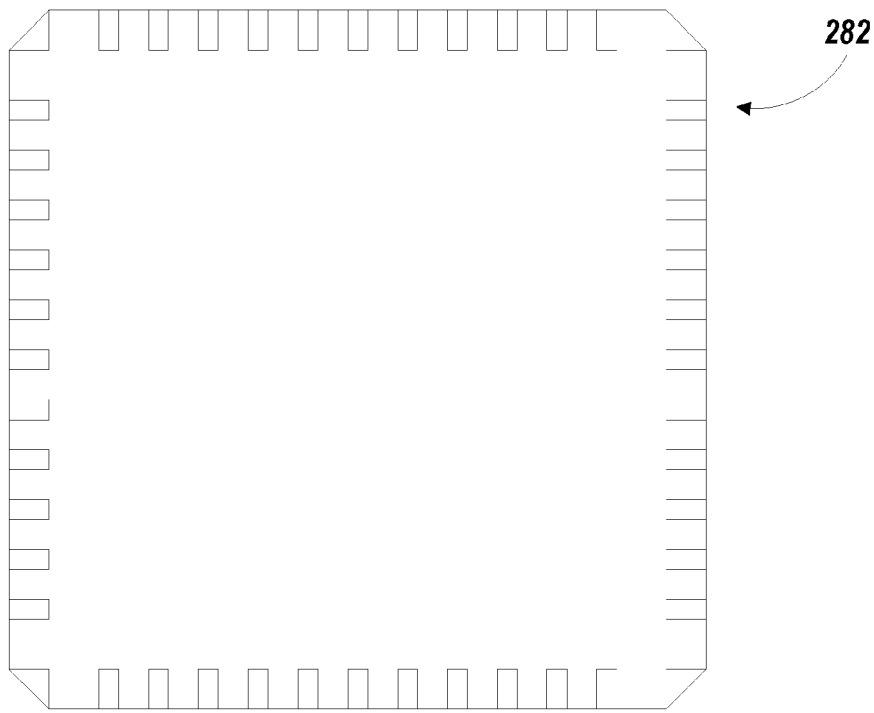
FIG. 29 is a top three-dimensional view of a singulated unit, in accordance with one embodiment of the invention.

FIG. 29 is a top three-dimensional view of a singulated leadframe unit 282, in accordance with one embodiment of the present invention.

Figure 30:
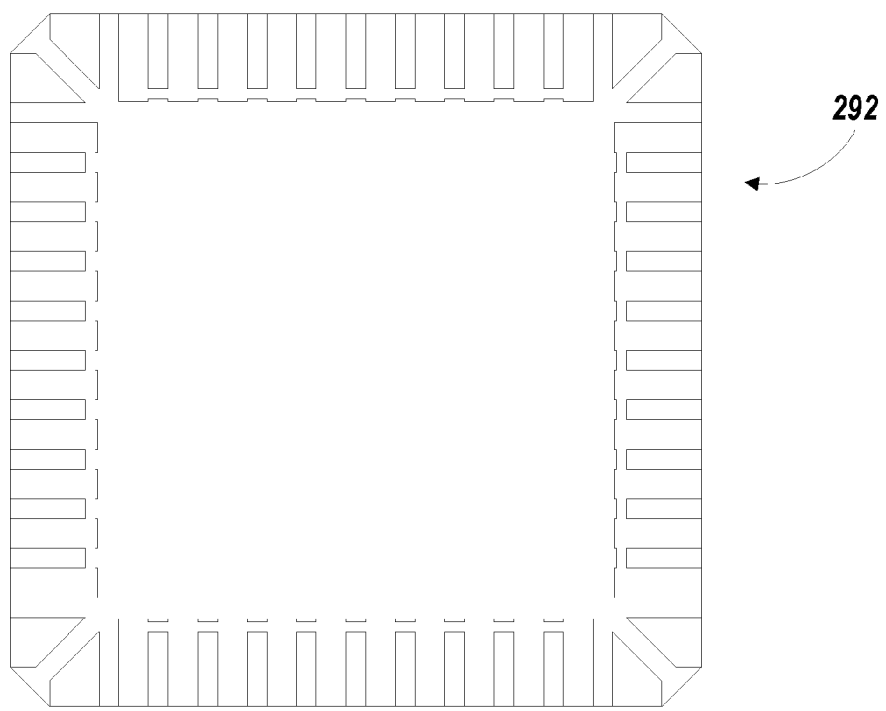
FIG. 30 is a bottom three-dimensional view of a singulated unit, in accordance with one embodiment of the invention.

FIG. 30 is a bottom three-dimensional view of a singulated leadframe unit 292, in accordance with one embodiment of the present invention.

Although not illustrated, the electronic packages can be configured such that the top side of the electronic package can be mounted onto a printed circuit board (PCB) with the bottom side of the package facing upwards with the exposed metal die paddle facing away from the PCB surface. An additional heatsink can also be attached to the metal die paddle for enhanced heat dissipation. Additionally the electronic packages can be stacked one on top of the other depending on the required application. In this embodiment, instead of stacking two or more chips within one package for additional functionality, two or more packages are staked on top of each other, where each package can have one chip with specific functionality.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A method of making packages comprising:
providing a leadframe strip that includes a plurality of leadframes, each of the leadframes having a plurality of leads surrounding a die paddle;
etching a surface of each of the leadframes to form a recessed region extending over an entire surface of the die paddle and over a portion of each of the leads closest to the die paddle, wherein each of the leads of each leadframe has a lead tip that is connected to the die paddle during the etching; thereafter
plating the leadframe strip to prepare the leads of each leadframe for die connection; thereafter
isolating each of the lead tips from the die paddle of each leadframe;
removing the die paddle of each leadframe;
adhering a tape to a bottom side of the leadframe strip including the leads of each leadframe; and
within each leadframe, attaching a flip chip to each of the lead tips.

2. The method of claim 1, wherein the leadframe strip is plated with NiPdAu.

3. The method of claim 1, wherein attaching the flip chip comprises connecting a plurality of metal bumps from the flip chip to each of the lead tips of a corresponding leadframe.

4. The method of claim 1 further comprising providing molded ribs to the leadframe strip.

5. The method of claim 1 comprising creating a mold cap over the recessed region of each leadframe, thereby encapsulating the die.

* * * * *